United States Patent [19]

Kubota et al.

[11] Patent Number: 5,898,322

[45] Date of Patent: Apr. 27, 1999

[54] LOGIC CIRCUIT FOR LIQUID CRYSTAL DISPLAY HAVING PASS-TRANSISTOR LOGIC CIRCUITRY AND THIN FILM TRANSISTORS

[75] Inventors: Yasushi Kubota, Sakurai; Hiroshi Yoneda, Ikoma, both of Japan

[73] Assignee: Sharp Kabushiki Kaisha, Osaka, Japan

[21] Appl. No.: 08/524,503

[22] Filed: Sep. 7, 1995

[30] Foreign Application Priority Data

Sep. 13, 1994 [JP] Japan .................. 6-219088

[51] Int. Cl.⁶ .................. H03K 19/094; H01L 27/00
[52] U.S. Cl. .................. 326/113; 326/103; 345/92
[58] Field of Search ............ 326/83, 104, 112–113; 345/92, 98, 100, 87

[56] References Cited

U.S. PATENT DOCUMENTS

| | | | |
|---|---|---|---|
| 5,404,151 | 4/1995 | Asada | 345/100 |
| 5,418,480 | 5/1995 | Hastie et al. | 326/113 |
| 5,510,805 | 4/1996 | Lee | 345/58 |
| 5,543,791 | 8/1996 | Riggio, Jr. | 365/219 X |
| 5,572,151 | 11/1996 | Hanawa et al. | 326/113 |

FOREIGN PATENT DOCUMENTS

A0552734  7/1993  European Pat. Off. .
62-298226  12/1987  Japan .
6-95849    4/1994   Japan .

OTHER PUBLICATIONS

Yano et al, "A 3.8-ns CMOS 16×16-b Multiplier Using Complementary Pass-Transistor Logic", IEEE Journal of Solid-State Circuits, vol. 25, No. 2, pp. 388-395, 1990.

Mori et al, "A 10-ns 54×54-b Parallel Structured Full Array Multiplier with 0.5-μm CMOS Technology", IEEE Journal of Solid-State Circuits, vol. 26, No. 4, pp. 600-606, 1991.

Primary Examiner—Jon Santamauro
Attorney, Agent, or Firm—Nixon & Vanderhye, P.C.

[57] ABSTRACT

A logic circuit performs a logic operation on a plurality of input logic signals and outputting a resultant logic signal. The logic circuit comprises a pass-transistor logic circuit including: a plurality of field effect transistors, at least two of the plurality of field effect transistors being coupled in series, a gate electrode of each of the at least two field effect transistors receiving a corresponding first logic signal, and one of drain and source electrodes ditto receiving a corresponding second logic signal; and a node for coupling the other of the drain and source electrodes of the at least two field effect transistors, and for outputting the resultant logic signal. The plurality of field effect transistors are thin film transistors (TFTs).

16 Claims, 19 Drawing Sheets

FIG.13
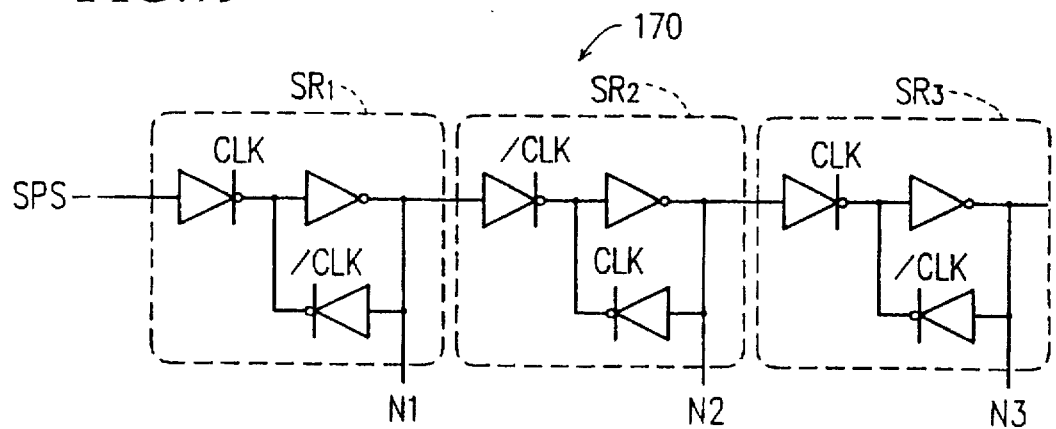
FIG.14A1  N1
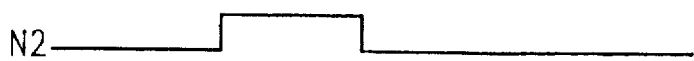
FIG.14A2  N2
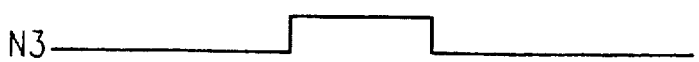
FIG.14A3  N3
FIG.14B1  N1∩N2
FIG.14B2  N2∩N3
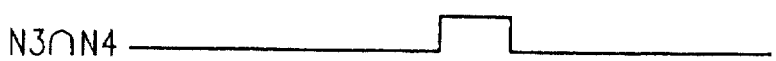
FIG.14B3  N3∩N4

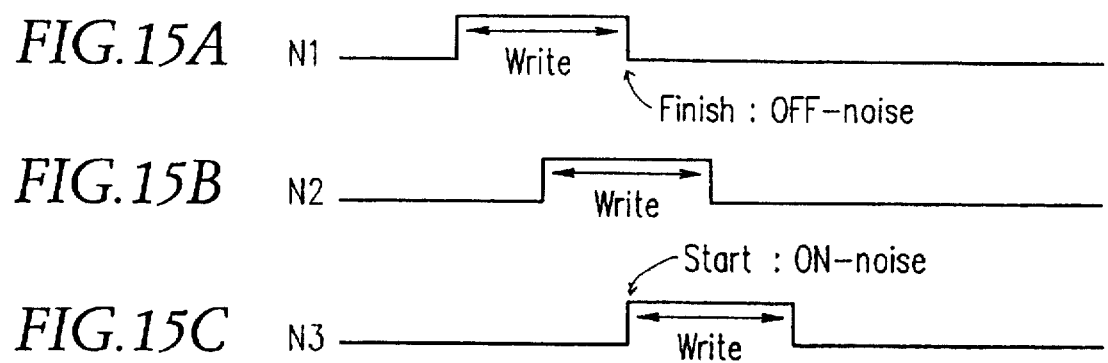

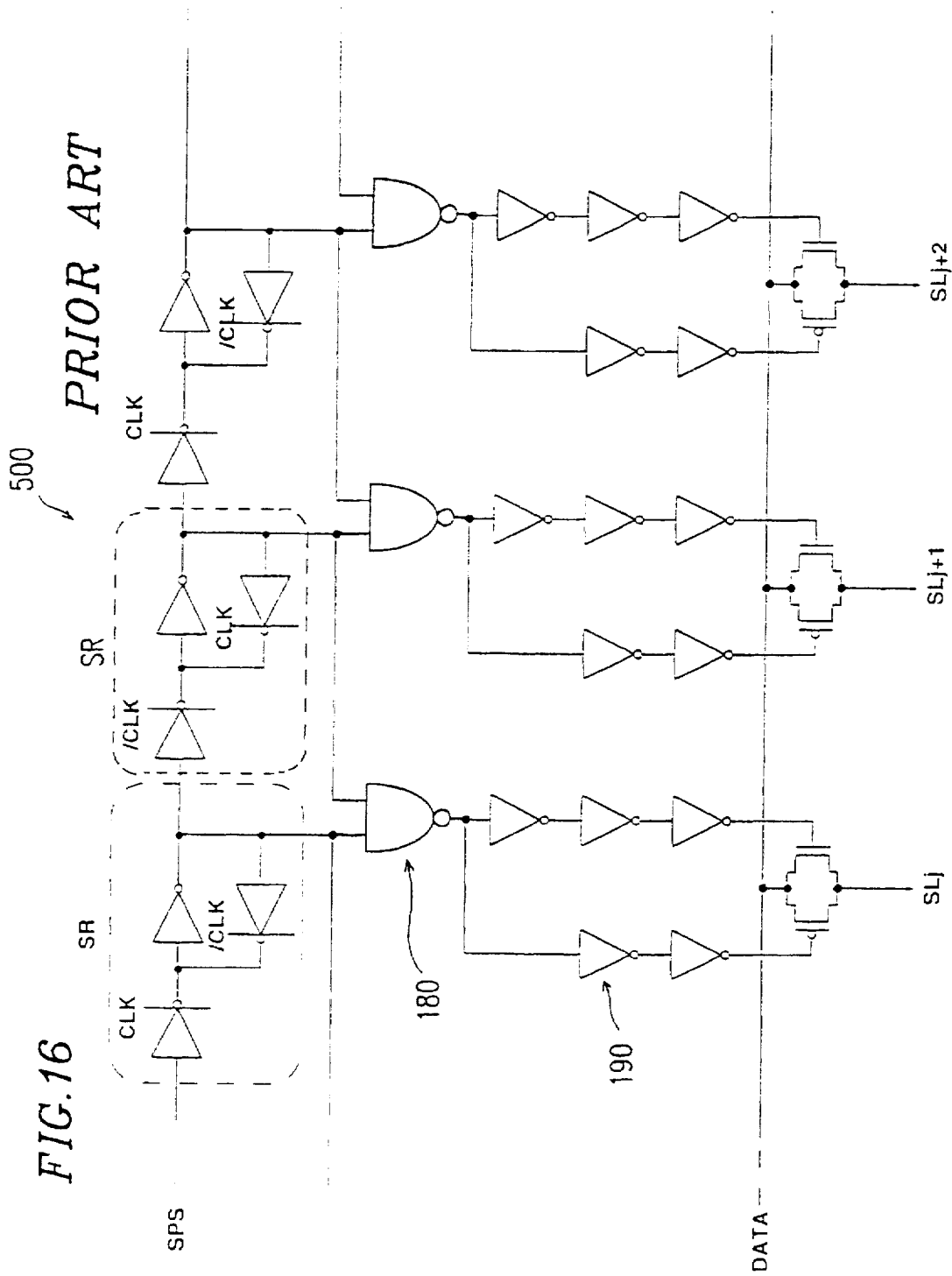

PRIOR ART

LOGIC CIRCUIT FOR LIQUID CRYSTAL DISPLAY HAVING PASS-TRANSISTOR LOGIC CIRCUITRY AND THIN FILM TRANSISTORS

BACKGROUND OF THE INVENTION

1. Field of the Invention

The present invention relates to a logic circuit and a liquid crystal display, and more particularly, to a logic circuit which includes pass-transistor logic using field effect thin film transistors (TFTs) and a liquid crystal display which uses the pass-transistor logic circuit.

2. Description of the Related Art

A logic circuit which is used in a semiconductor device is required to have high performance with respect to operation speed, power consumption, occupation area, and operation stability. The demand for improved performance has further increased as systems using semiconductor devices have been further miniaturized and highly integrated.

CMOS logic is well known as a conventional logic circuit. FIGS. 22A to 24B show basic logic gates which include a plurality of field effect transistors coupled between a source supply terminal (VCC) and a grounded terminal (GND). The transistors are operated by utilizing the voltage difference between the source supply voltage and the ground voltage, and a binary logic signal is input to a gate electrode of each transistor.

FIGS. 22A and 22B, respectively, show a circuit structure and the corresponding logic function (INV) of an inverter circuit 1. FIGS. 23A and 23B, respectively, show a circuit structure and the corresponding logic function (NAND) of a negative AND circuit 2. FIGS. 24A and 24B, respectively, show a circuit structure and the corresponding logic function (NOR) of a negative OR circuit 3. A more complicated logic function can be implemented by a combination of these basic logic circuits in accordance with Boolean algebra.

For example, an exclusive OR (XOR) function as shown in FIG. 25A is implemented as an XOR circuit 10 by using two INV circuits 1 and three NOR circuits 2 as shown in FIG. 25B. The XOR circuit 10 is a relatively large circuit in that it requires a large number of gates. FIG. 25C shows a CMOS logic circuit 11 consisting of three XOR circuits 10 cascaded in series. The CMOS logic circuit 11, which includes forty eight (48) transistors, is a significantly large circuit as will be appreciated.

In recent years, a pass-transistor logic circuit has been proposed and has received considerable attention (see, e.g., IEEE JOURNAL OF SOLID-STATE CIRCUITS, Vol. 25, No. 2, April 1990, pp. 388–395). The pass-transistor logic circuit described in such article consists of n-channel MOS transistors. A binary logic signal is input to a gate electrode and a drain electrode so that the number of the transistors included in the logic circuit is reduced in order to realize higher operation speed and to reduce power consumption.

FIGS. 26A to 28B show typical pass-transistor logic circuits. FIGS. 26A and 26B respectively show a circuit structure and the corresponding logic function of an AND/NAND circuit 4. Signals A (/A) and B (/B) are input to the AND/NAND circuit 4, and an AND operation result C and a NAND operation result /C of the signals A and B are output.

Similarly, FIGS. 27A and 27B respectively show a circuit structure and the corresponding logic function of an OR/NOR circuit 5. FIGS. 28A and 28B show, respectively, a circuit structure and the corresponding logic function of an XOR/XNOR circuit 6.

In the case of a relatively simple logic function, such as an AND/NAND or OR/NOR function, there is no significant difference in the number of transistors utilized between the CMOS logic and the pass-transistor logic circuit. However, in a case of a relatively complicated logic function such as XOR/XNOR function, the number of transistors included in the pass-transistor logic circuit is much smaller than the number included in the CMOS logic circuit, as shown FIG. 28A.

The conventional pass-transistor logic circuit described above has the following problems:

Because signals are propagated by the n-channel transistors only, a voltage level of an output signal is intrinsically reduced from the power supply voltage level by an amount of the threshold voltage of the transistors, and the higher voltage level of the output signal alone will not be sufficient. In a case where p-channel transistors are used, the lower voltage level of the output signal is deteriorated.

When n-channel transistors formed in a P-type semiconductor substrate are used, a voltage level of the substrate is set so that an opposite bias voltage is applied between a bulk portion of the substrate and source and drain regions of n-channel transistors in order to operate the transistors stably. In the case, for example, where a signal having a high voltage level is transferred, voltage levels of the source and drain electrodes become higher than that of the substrate. In such a case, an effective threshold voltage (i.e., a gate voltage level of a channel which is formed beneath the gate electrode) becomes higher due to the substrate voltage effect. Accordingly, for example, with a source voltage level of 5V and a threshold voltage of 0.8V , an output voltage level will be about 3.3V, which is reduced by 1.7V from the source voltage level. This reduces an available voltage level for properly operating the transistors of the logic circuit, so that an error operation will occur in the logic circuit unless measures are taken to avoid such error.

In the pass-transistor logic circuit, a load on an input signal which is input to the drain electrode of the transistor is relatively large because the input signal drives (i.e., charges and discharges) a capacitance between the channel and the gate electrode (i.e., the gate insulator capacitance) as well as a parasitic capacitance between the source and drain electrodes and the substrate (i.e., the pn junction capacitance). In the case of a pass-transistor logic circuit which includes multiple basic logic gates connected in series, an input signal is used for driving a plurality of channel-gate capacitances, source-substrate capacitances, and drain-substrate capacitances. Accordingly an output signal from the pass-transistor logic circuit will be deteriorated. In order to eliminate such a problem, a buffer circuit such as an inverter for shaping the output signal is required for every couple of stages of the basic logic gates. The buffer circuit offsets the advantages of high operation speed and reduction of the number of the transistors otherwise obtained by using the pass-transistor logic circuit.

In addition, a pass-transistor logic circuit consists of single type of transistors (n-channel transistors in the above described example), so that the structure of the logic circuit and that of a buffer circuit, which consists of CMOS transistors, are not consistent. The number of n-channel transistors and p-channel transistors used in the logic circuit and the buffer circuit are different, so that the n-channel transistors and p-channel transistors are arranged in a random manner, resulting in a complicated well structure in a semiconductor substrate. For example, a well will have a complicated shape, be divided into many small parts, have a large invalid region, and it will be difficult to provide a stable well source supply, etc. This makes it difficult to arrange an effective well layout for transistors in the semiconductor substrate.

SUMMARY OF THE INVENTION

The logic circuit of the present invention performs a logic operation on a plurality of input logic signals and outputs a resultant logic signal. The logic circuit comprises a pass-transistor logic circuit, wherein field effect transistors included in the pass-transistor circuit are thin film transistors.

In one embodiment of the present invention, the logic circuit of this invention comprises a pass-transistor logic circuit including: a plurality of field effect transistors, at least two of the plurality of field effect transistors being coupled in series, a gate electrode of each of the at least two field effect transistors receiving a corresponding first logic signal, and one of drain and source electrodes ditto receiving a corresponding second logic signal; and a node for coupling the other of the drain and source electrodes of the at least two field effect transistors, and for outputting the resultant logic signal, wherein the plurality of field effect transistors are thin film transistors (TFTs).

In another embodiment of the present invention, the logic circuit comprising a pass-transistor logic circuit including: a plurality of field effect transistors, at least two of the plurality of field effect transistors being coupled in series to form a pair, a gate electrode of each field effect transistor of the pair receiving a corresponding first logic signal, and one of drain and source electrodes ditto receiving a corresponding second logic signal; and a node for coupling the pair and other of the plurality of field effect transistors, and for outputting the resultant logic signal, wherein the plurality of field effect transistors are thin film transistors (TFTs).

In still another embodiment of the present invention, the pass-transistor logic circuit includes a pair of nodes for outputting a pair of signals comprising the resultant logic signal and an inverted signal thereof.

In still another embodiment of the present invention, the pass-transistor logic circuit consists of common channel type TFTs of which an ON-resistance per channel width is less than that of other channel type TFTs.

In still another embodiment of the present invention, the pass-transistor logic circuit includes both n-channel TFTs and p-channel TFTs.

In still another embodiment of the present invention, a thin film of each TFT is made of one of amorphous silicon, polycrystalline silicon, and monocrystalline silicon.

In still another embodiment of the present invention, the thin film of the TFTs is a polycrystalline silicon thin film formed on a glass substrate.

In still another embodiment of the present invention, the pass-transistor logic circuit is formed on a substrate, and switching TFTs for a pixel array of a liquid crystal display also being formed on the substrate.

The liquid crystal display according to the present invention comprising: a pixel array including a plurality of pixels arranged in a matrix on an insulator substrate; a plurality of data signal lines for supplying a data signal to each pixel; a plurality of scanning signal lines for supplying a scanning signal to each pixel, the scanning signal controlling the supply of the data signal to the pixel; a data signal line driving circuit for controlling apply of the data signal to each of the data signal lines: and a scanning signal line driving circuit for controlling apply of the scanning signal to each of the scanning signal lines. At least one of the pixel array, the data signal line driving circuit, and the scanning signal line driving circuit comprises a logic circuit for performing a logic operation on a plurality of input logic signals and outputting a resultant logic signal, wherein the logic circuit comprises a pass-transistor logic circuit including: a plurality of field effect transistors, at least two of the plurality of field effect transistors being coupled in series, a gate electrode of each of the at least two field effect transistors receiving a corresponding first logic signal, and one of drain and source electrodes ditto receiving a corresponding second logic signal; and a node for coupling the other of the drain and source electrodes of the at least two field effect transistors, and for outputting the resultant logic signal, and wherein the plurality of field effect transistors are thin film transistors (TFTs).

In one embodiment of the present invention, the logic circuit comprises a pass-transistor logic circuit including: a plurality of thin film transistors (TFTs); a first node for coupling source electrodes of a first TFT and a second TFT included in the plurality of TFTs, and for outputting a resultant logic signal; and a second node for coupling source electrodes of a third TFT and a fourth TFT included in the plurality of TFTs, and for outputting an inverted signal of the resultant logic signal, wherein a first logic signal is input to a drain electrode of the first TFT, an inverted first logic signal is input to a drain electrode of the third TFT, a second logic signal is input to a drain electrode of the second TFT and an inverted second logic signal is input to a drain electrode of the fourth TFT, and wherein one of the second logic signal and the inverted second logic signal is input to gate electrodes of the first TFT and the third TFT, and the other of the second logic signal and the inverted second logic signal is input to gate electrodes of the second TFT and the fourth TFT.

In another embodiment of the present invention, the logic circuit comprises a pass-transistor logic circuit including: a plurality of thin film transistors (TFTs); a first node for coupling source electrodes of a first TFT and a second TFT included in the plurality of TFTs, and for outputting a resultant logic signal; and a second node for coupling source electrodes of a third TFT and a fourth TFT included in the plurality of TFTs, and for outputting an inverted resultant logic signal, wherein a first logic signal is input to drain electrodes of the first TFT and the fourth TFT, and an inverted first logic signal is input to drain electrodes of the second TFT and the third TFT, and wherein a second logic signal is input to gate electrodes of the second TFT and the fourth TFT, and an inverted second logic signal is input to gate electrodes of the first TFT and the third TFT.

In still another embodiment of the present invention, the logic circuit comprises a pass-transistor logic circuit including a plurality of thin film transistors (TFTs), wherein at least two TFTs of the plurality of TFTs are coupled in series to form a pair, the TFTs included in the pair consisting of common channel type TFTs, a gate electrode of each TFT of the pair receiving a corresponding first logic signal, and one of drain and source electrodes of each TFT of the pair receiving a corresponding second logic signal, and wherein a complimentary TFT of other channel type is provided for each TFT of the pair, a gate electrode of the complementary TFT receiving the corresponding first logic signal.

Thus, the invention described herein makes possible the advantages of (1) providing a pass-transistor logic circuit in which the substrate voltage effect is eliminated so that a sufficient voltage level for properly operating transistors is provided, (2) providing a pass-transistor logic circuit in which the complicated well structure is avoided so that transistors are easy to lay out, (3) providing a pass-transistor logic circuit which realizes high operation speed, and in which an area and power consumption thereof is reduced, and (4) a liquid crystal display which includes the pass-transistor logic circuit.

These and other advantages of the present invention will become apparent to those skilled in the art upon reading and understanding the following detailed description with reference to the accompanying figures.

BRIEF DESCRIPTION OF THE DRAWINGS

FIG. 13 is a diagram of a shift register portion of the data signal line driving circuit.

FIGS. 14A1 through 14A3 are diagrams illustrating waveforms of sampling signals output from the shift register potion to internal nodes in the data signal line driving circuit.

FIGS. 14B1 through 14B3 are diagrams illustrating waveforms of logic (AND) signals output from the pass-transistor logic circuits in the data signal line driving circuit.

FIGS. 15A through 15B are diagrams illustrating fluctuation in a video signal when the video signal is supplied to a data signal line to be written in the pixel.

FIG. 16 is a diagram of a conventional data signal line driving circuit in which a conventional CMOS logic circuit is used.

DESCRIPTION OF THE PREFERRED EMBODIMENTS

Hereinafter, the present invention will be described by way of illustrative examples with reference to the accompanying drawings.

EXAMPLE 1

Figure 1:
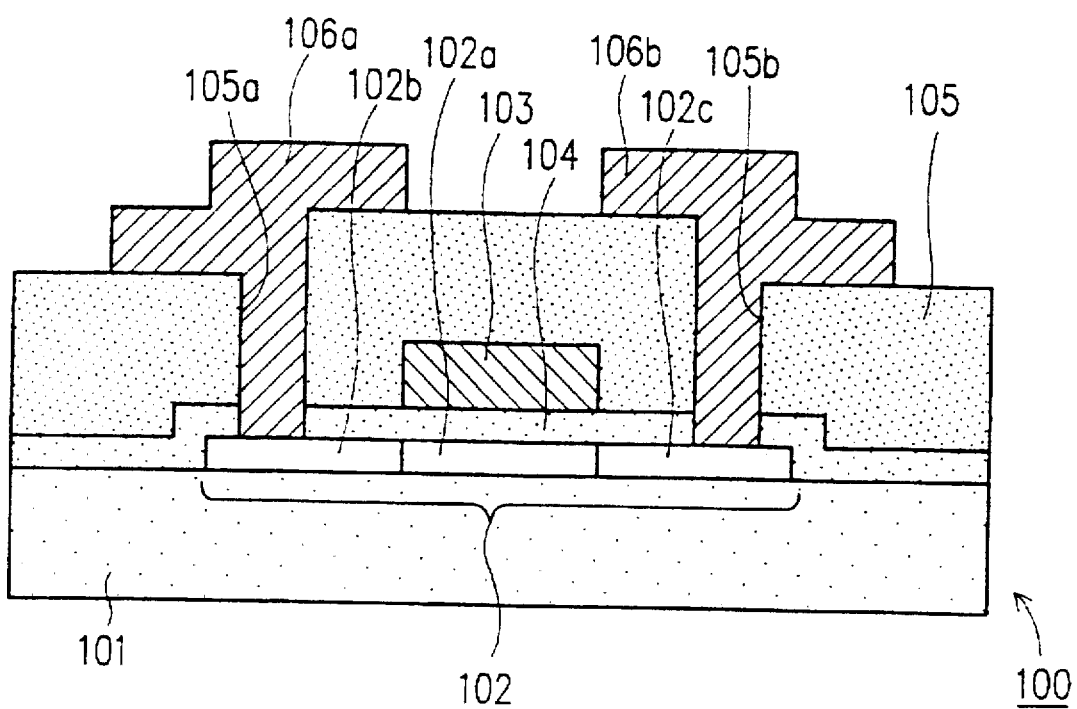
FIG. 1 is a cross-sectional view of a thin film transistor used in a pass-transistor logic circuit of the present invention.

FIG. 1 shows a structure of a thin film transistor (TFT) 100 which is used in a pass-transistor logic circuit of the present invention. In the TFT 100, an active layer 102 is formed on an insulator substrate 101. In this example, a silicon film is used as the active layer 102. The silicon film may be made of monocrystalline silicon, polycrystalline silicon, or amorphous silicon, for example. The insulator substrate 101 may be made of an insulator such as quartz, sapphire, or glass, or may be a substrate provided with an insulating layer such as a silicon substrate having an oxidized surface as the insulating layer.

The active layer 102 includes a channel region 102a, and a source region 102b and a drain region 102c which are provided on each side of the channel region 102a. The source region 102b and the drain region 102c are formed by doping an impurity into the silicon film. The transistor is formed as an n-channel transistor or a p-channel transistor according to the impurity. For example, an n-channel transistor is formed by doping a V-group element such as phosphorus or arsenic into the silicon film. On the other hand, a p-channel transistor is formed by doping a III-group element such as boron into the silicon film.

A gate insulating film 104 such as an oxidized silicon film is formed on the substrate 101 covering the active layer 102. A gate electrode 103 is formed on the channel region 102a via the insulating film 104 interposed therebetween. The gate electrode 103 may be made of polycrystalline silicon, tungsten, titanium, molybdenum, or aluminum, for example.

An inter-layer insulating film 105 such as an oxidized silicon film is formed on the gate electrode 103 and the insulating film 104. The insulating films 105 and 104 have contact-holes 105a and 105b corresponding to the source region 102b and the drain region 102c, respectively. A source electrode 106a and a drain electrode 106b are formed on the insulating film 105. The source electrode 106a is connected to the source region 102b of the active layer 102 through the contact-hole 105a. The drain electrode 106b is connected to the drain region 102c of the active layer 102 through the contact-hole 105b. The source and drain electrodes 106a and 106b may be made of aluminum, copper, or the like.

Figure 2A:
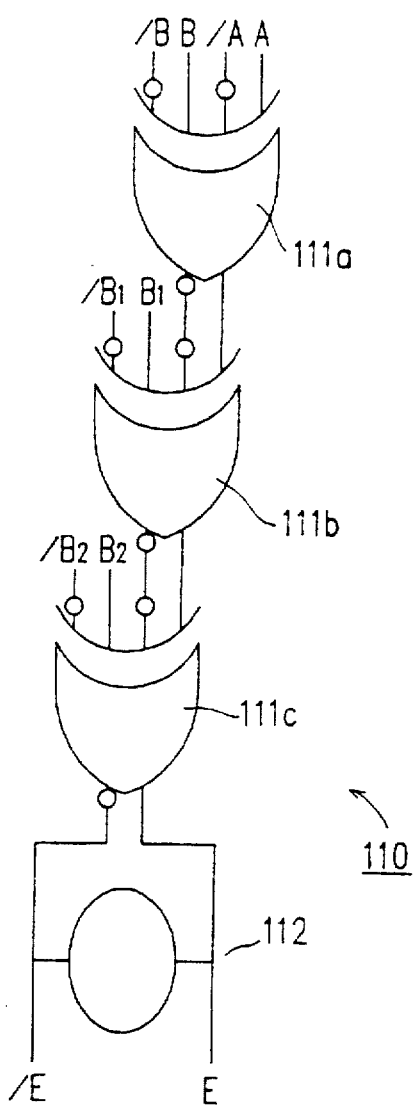
FIG. 2A is a diagram of a pass-transistor logic circuit according to the first example of the present invention.
Figure 2D:
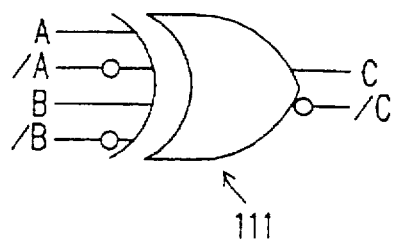
FIGS. 2D and 2E are diagrams illustrating logic functions of the XOR/XNOR circuit and the pull-up circuit shown in FIGS. 2B and 2C, respectively.
Figure 3:
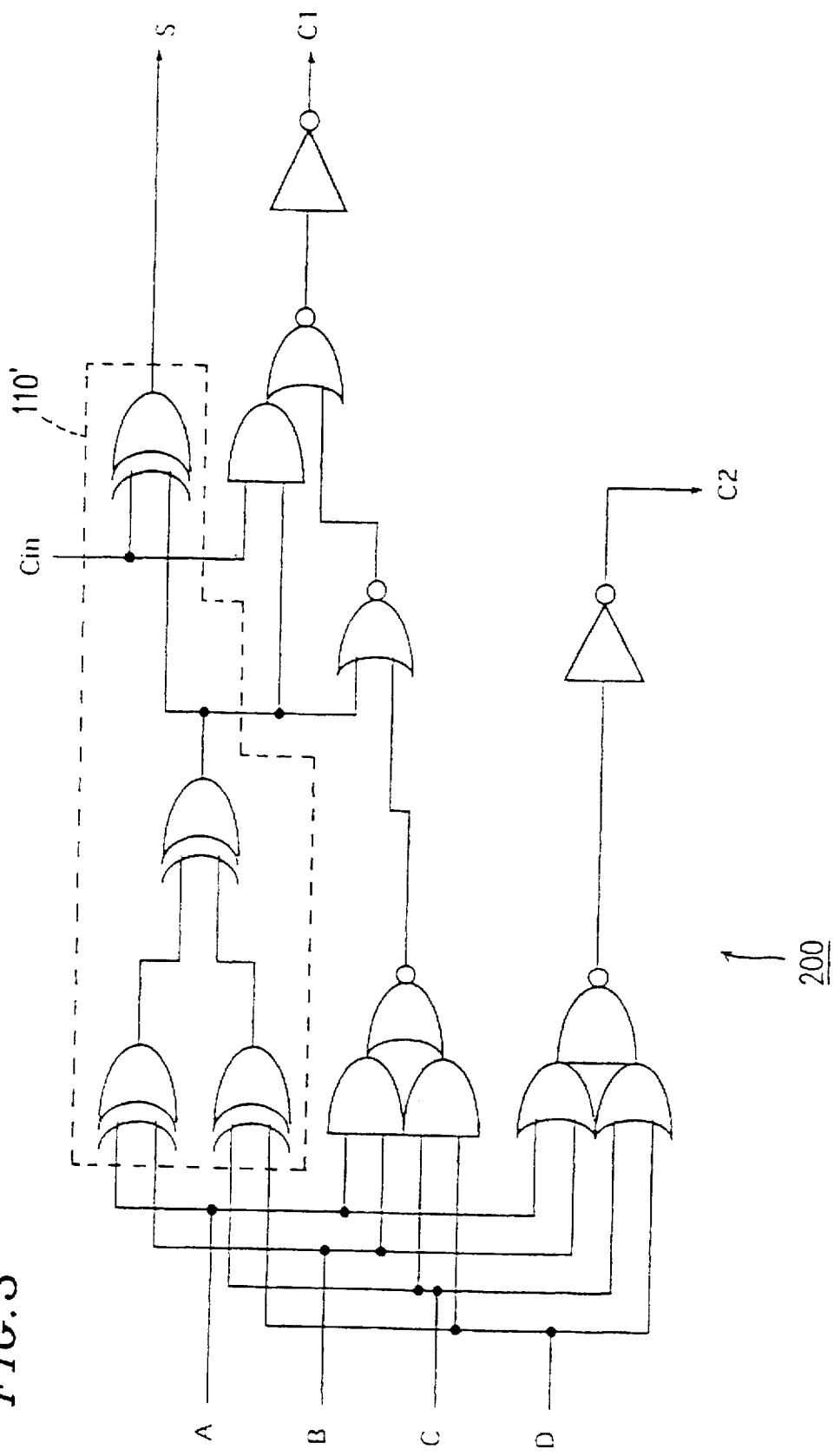
FIG. 3 is a diagram of a 4-2 compressor in which the pass-transistor logic circuit shown in FIG. 2A is used.

FIG. 2A shows a pass-transistor logic circuit 110 of the present invention. The pass-transistor logic circuit 110 includes three XOR/XNOR logic circuits 111 as shown in FIG. 2D coupled in a series. The pass-transistor logic circuit 110 is used in, for example, a 4-2 compressor 200 as shown in FIG. 3. In FIG. 3, the corresponding logic circuit 110' which has the same logic stages as the pass-transistor logic circuit 110 is shown. The 4-2 compressor 200 is a common module used for a multiplier incorporated in a CPU as will be appreciated by those having ordinary skill in the art.

The pass-transistor logic circuit 110 of FIG. 2A corresponds to a critical path in the 4-2 compressor 200, which is a signal path having the maximum time delay (see, e.g., IEEE JOURNAL OF SOLID-STATE CIRCUITS, Vol. 26, No. 4, April 1991 pp. 600–606). Four signals A, B, C, and D are input to the 4-2 compressor 200, and the 4-2 compressor 200 outputs signals S, C1, and C2. The critical path of the 4-2 compressor 200 is the path for outputting a summation signal S as shown in FIG. 3, i.e., the logic circuit 110'.

Figure 2B:
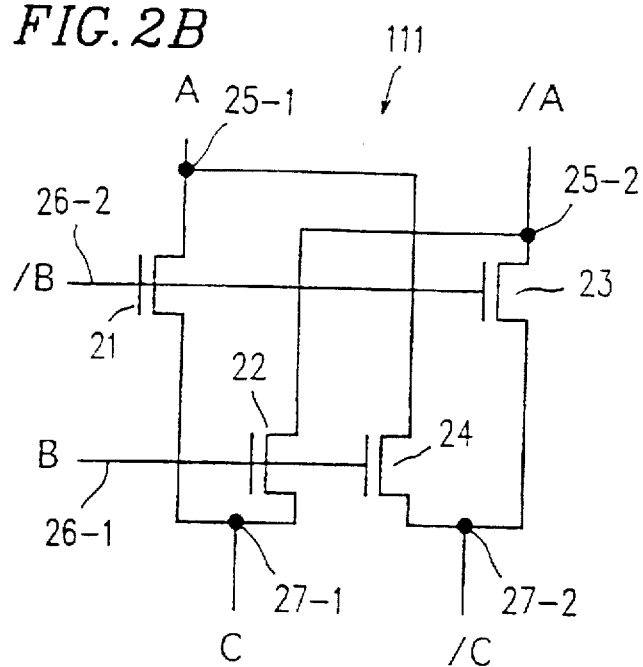
FIGS. 2B and 2C are diagrams illustrating, respectively, circuit structures of an XOR/XNOR circuit and a pull-up circuit used in the pass transistor circuit shown in FIG. 2A.

FIG. 2B shows a structure of the XOR/XNOR circuit 111. The XOR/XNOR circuit 111 includes four transistors 21 to 24. Source electrodes of the transistors 21 and 22 are connected to an output terminal (node) 27-1 for outputting a logic signal C. Similarly, source electrodes of the transistors 23 and 24 are connected to another output terminal (node) 27-2 for outputting a logic signal /C. An input signal A is input to respective drain electrodes of the transistors 21 and 24 via an input terminal 25-1, and an input signal /A is input to respective drain electrodes of the transistors 22 and 23 via another input terminal 25-1. An input signal B is input to respective gate electrodes of the transistors 22 and 24 via an input terminal 26-1, and an input signal /B is input to respective gate electrodes of the transistors 21 and 23 via an input terminal 26-2.

The signals /A, /B, and /C are inverted signals of the signals A, B, and C, respectively, where "inverted" means that when the signal goes high, the inverted signal goes low, and vice versa. This designation method is the same for signals other than the signals A, B, and C.

Figure 2C:
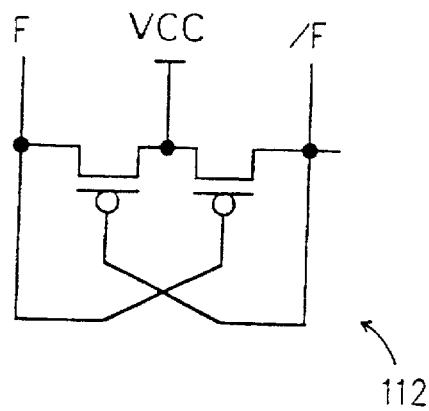
Figure 2E:
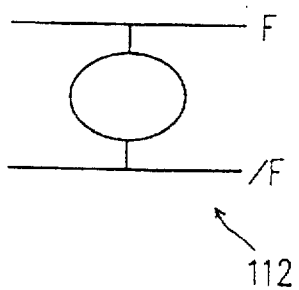

As shown in FIG. 2A, a pull-up circuit 112, the structure of which is shown in FIG. 2C, is provided to an output portion of the pass-transistor logic circuit 110. The pull-up circuit is used for recovering an amplitude of the output signal of the pass-transistor logic circuit 110, the amplitude having been reduced by an amount of the threshold voltage of the transistors. FIG. 2E shows a schematic symbol of the pull-up circuit 112.

As shown in FIG. 2A, the pass-transistor logic circuit 110 outputs a pair of logic signals E and /E, and the logic information is transferred by the voltage difference between the signals E and /E. Accordingly, a signal for operating the circuits has an amplitude twice as large as a single signal E or /E. This makes it possible to obtain an sufficient voltage level of the signal for proper operation of the circuits.

In general, an n-channel transistor has a conductance which is larger than that of a p-channel transistor. This is because the mobility of electrons is larger than that of holes. Accordingly, n-channel transistors are more advantageous than p-channel transistors for improving operation speed.

However, in some cases involving polycrystalline silicon thin film transistors, the structure of the n-channel transistors are modified in order to control a breakdown voltage and/or a leak current. For example, a channel width is increased, an LDD structure or an offset structure is adopted, and the like. In such cases, the conductance of ordinary p-channel transistors is larger than that of the modified n-channel transistors, i.e. an ON-resistance per channel width which includes a parasitic resistance on the both sides of the channel region in the p-channel transistor is smaller than that of the modified n-channel transistor. In such a case, it is preferable to use p-channel transistors instead of n-channel transistors for the pass-transistor logic circuit. In the present invention, transistors of either channel type which have a larger conductance are selectively used for the pass-transistor logic circuit.

Now, the pass-transistor logic circuit 110 (shown in FIG. 2A) of the present invention will be compared with the conventional CMOS logic circuit 11 (shown in FIG. 25A) which has the same logic function as the pass-transistor logic circuit 110. The number of the transistors of the pass-transistor logic circuit 110 is fourteen (14), which is significantly smaller than the forty eight (48) transistors of the conventional CMOS logic circuit 11. In addition, an area for the pass-transistor logic circuit 110 is reduced as the number of the transistors is minimized, and parasitic capacitances are also reduced so that the power consumption is reduced.

Figure 4:
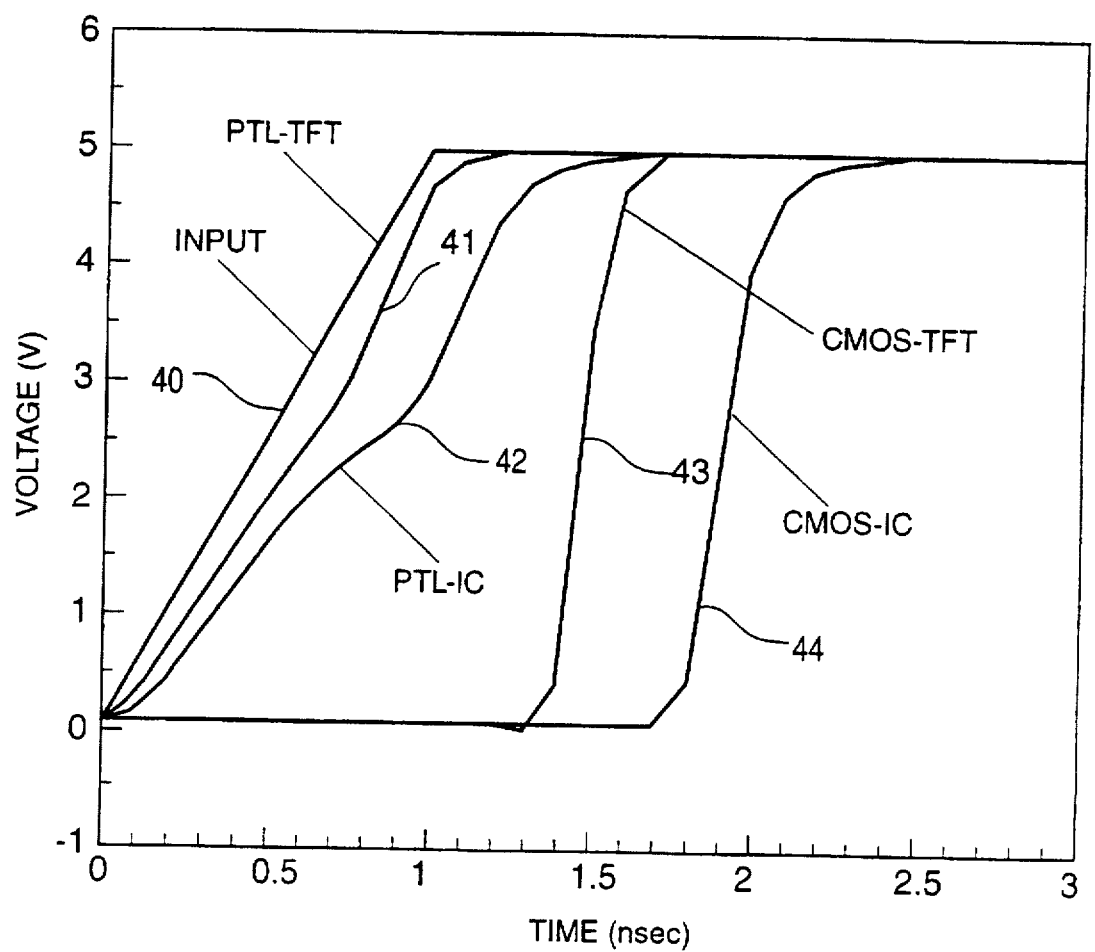
FIG. 4 is a diagram illustrating a simulation result for operation characteristics of the pass-transistor logic circuit shown in FIG. 2A and a conventional CMOS logic circuit shown in FIG. 25A.
Figure 25B:
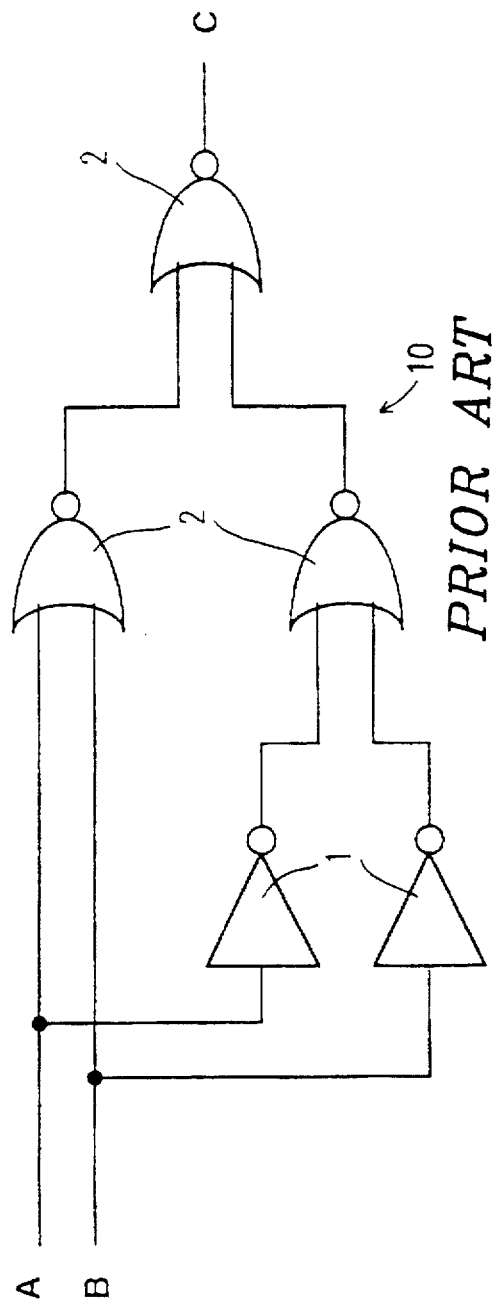
FIG. 25B is a diagram illustrating a circuit structure of the conventional CMOS logic circuit (XOR) shown in FIG. 25A.
Figure 25C:
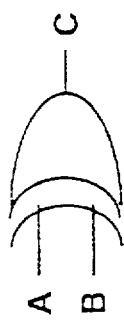
FIG. 25C is a diagram illustrating a circuit structure of a conventional CMOS logic circuit consisting of three XOR logic circuits shown in FIG. 25A.
Figure 25A:
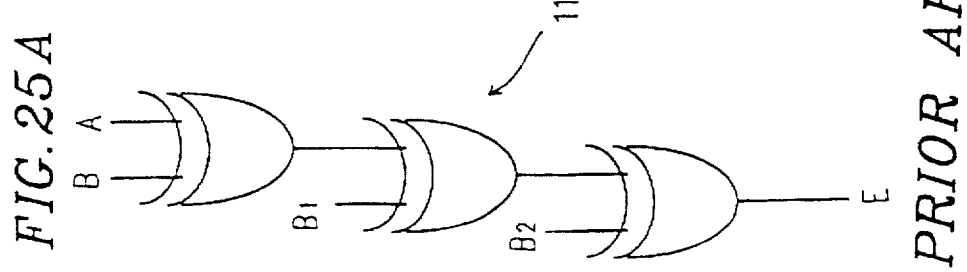
FIG. 25A is a diagram illustrating a logic function of a conventional CMOS logic circuit (XOR).
Figure 26A:
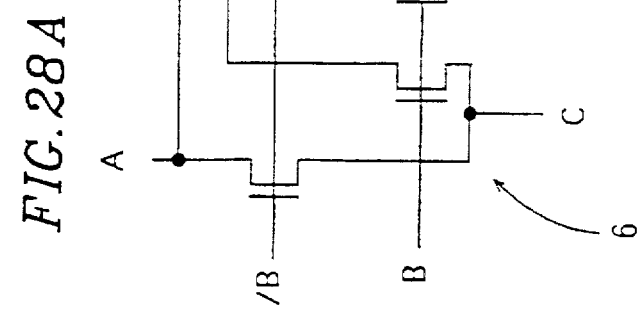
FIGS. 26A and 26B are diagrams illustrating a circuit structure and a corresponding logic function of a pass-transistor circuit (AND/NAND).
Figure 26B:
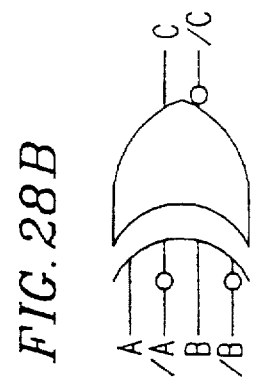
Figure 27A:
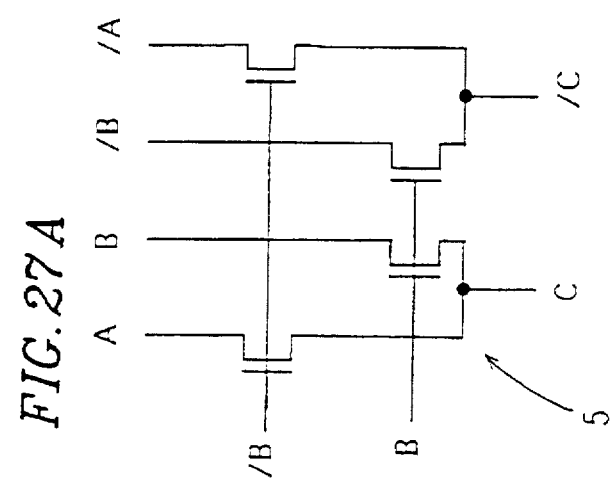
FIGS. 27A and 27B are diagrams illustrating a circuit structure and a corresponding logic function of a pass-transistor circuit (OR/NOR).
Figure 27B:
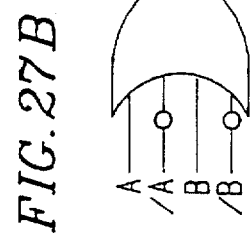
Figure 28A:
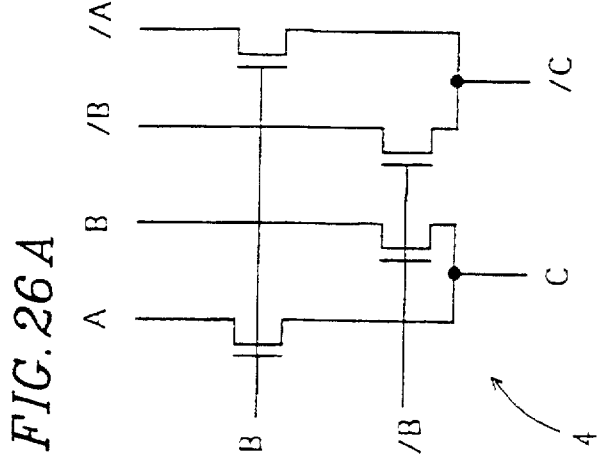
FIGS. 28A and 28B are diagrams illustrating a circuit structure and a corresponding logic function of a pass-transistor circuit (XOR/XNOR).
Figure 28B:
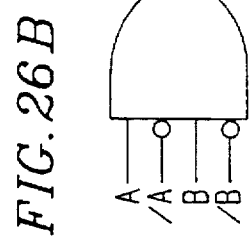

FIG. 4 shows simulation results of the operation of the three-stage XOR logic circuit of the pass-transistor logic circuit according to the present invention and that of the conventional CMOS logic circuit shown in FIGS. 2A and 25A, respectively. In FIG. 4, curve 40 (INPUT) denotes a waveform of an input signal A; curve 41 (PTL-TFT) denotes a waveform of an output signal E from the pass-transistor logic circuit 110 using thin film transistors; curve 42 (PTL- IC) denotes a waveform of an output signal from a pass-transistor logic circuit using transistors formed on a semiconductor substrate; curve 43 (CMOS-TFT) denotes a waveform of an output signal from the CMOS transistor logic using thin film transistors; and curve 44 (CMOS-IC) denotes a waveform of an output signal E from a CMOS transistor logic using transistors formed on a semiconductor substrate.

Each of the transistors used in above mentioned logic is assumed to have a gate width of 0.8 μm. Each of the thin film transistors are assumed to have a thin film made of monocrystalline silicon.

As shown in FIG. 4, when the input signal A goes high (and consequently the input signal /A goes low), the output signals from the respective logic circuits are fixed with respective time delays. The delay time is measured from the time when the input signal A comes to have an amplitude of ½ of the maximum amplitude to the time when the output signal E comes to have an amplitude of ½ of the maximum amplitude.

Curve 41 shows that the pass-transistor logic circuit 110 using the thin film transistors exhibits the least delay time. Using the thin film transistors instead of the transistors formed on the semiconductor substrate for the pass-transistor logic circuit improves the operation speed of the pass-transistor logic circuit. Comparing curve 42 and curve 41, the delay time is reduced to the ratio of about 0.41. On the other hand, in the case involving CMOS logic circuits (see curve 43 and curve 44), using thin film transistors reduces the delay time only to the ratio of about 0.69. Accordingly, the advantage of using thin film transistors instead of transistors formed on the semiconductor substrate is more significant in the case of pass-transistor logic circuit than that of CMOS logic circuits, as far as minimized delay time.

Comparing curve 42 and curve 44 which denote operations of the logic circuits using the transistors formed on the semiconductor substrate, the delay time is reduced to the ratio of about 0.25 by using pass-transistors instead of CMOS transistors. On the other hand, comparing curve 41 and curve 43 which denote operations of the logic circuits using the thin film transistors, the delay time is reduced to the ratio of about 0.15 by using pass-transistors instead of CMOS transistors. Accordingly, in the case where thin film transistors are used, the advantage of using pass-transistors instead of CMOS transistors is more significant as far as minimized delay time.

In this example, by employing the pass-transistor logic circuit, the number of the transistors included in the logic circuits is reduced. The number of transistors in a signal path is reduced so that the operation speed is improved and the power consumption is reduced.

In addition, according to the present invention, problems in producing the thin film transistors such as difficulty in making a minute structure are eliminated by reducing the number of the transistors. The difficulty is due to, for example, limitation of the temperature range in a process for improving the crystallization of the semiconductor layer on an insulating layer.

By using the thin film transistors, problems of conventional pass-transistor logic circuits can be eliminated. Because the thin film transistors do not have the substrate voltage effect in which the effective threshold voltage is increased when voltage levels of the source and the drain electrodes become higher than that of the substrate, the decrease in the signal level (an amplitude of the signal) is prevented so that the logic circuit can be operated properly and stably.

The thin film transistor has little parasitic capacitance between the source and drain electrodes and the substrate, so that the load of the input signal is significantly small comparing with the transistors formed on the semiconductor substrate. This makes it possible to improve further the operation speed and reduce the power consumption. In addition, by reducing the load of the input signal, the number of buffer circuits for shaping the output signal can be reduced. This makes it possible to miniaturize further the logic circuit.

The thin film transistor does not need to form wells in the semiconductor substrate, so that it is easy to arrange the layout of n-channel transistors and p-channel transistors which can be complicated in the pass-transistor logic circuit. In addition, space for arranging wells, rooms for boundaries of the wells, and wirings for setting well voltage levels are not required for the thin film transistors, so that the area for the logic circuits can be reduced.

In this example, whichever one channel type of thin film transistors which has a larger conductance than that of the other channel type is used for the pass-transistor logic circuit, so that higher operation speed is realized. For example, due to the carrier mobility, production process, structure of the transistor device, a channel width of the transistor, and the like, the conductance of the n-channel transistors is significantly different from that of the p-channel transistors. In such a case, it is very advantageous to constitute the pass-transistor logic circuit by using the channel type of the thin film transistors which has a larger conductance. Using one channel type of the transistors can reduce the number of production steps so as to increase the productivity.

By using a silicon thin film for the semiconductor layer of the thin film transistor, it is easy to apply conventional process techniques and design techniques of silicon material to the production of the logic circuits.

In a case where a polycrystalline silicon thin film formed on a glass substrate is used for the thin film transistors, the thin film transistors can be formed over a large area of the substrate. This makes it possible to use the thus made transistors for a display device which has a large display area and high display quality, not only for logic circuits provided in driving circuits for driving the display device.

EXAMPLE 2

In this example, an application of a pass-transistor logic circuit of the present invention which is used for a driving circuit of a liquid crystal display will be described.

Figure 5A:
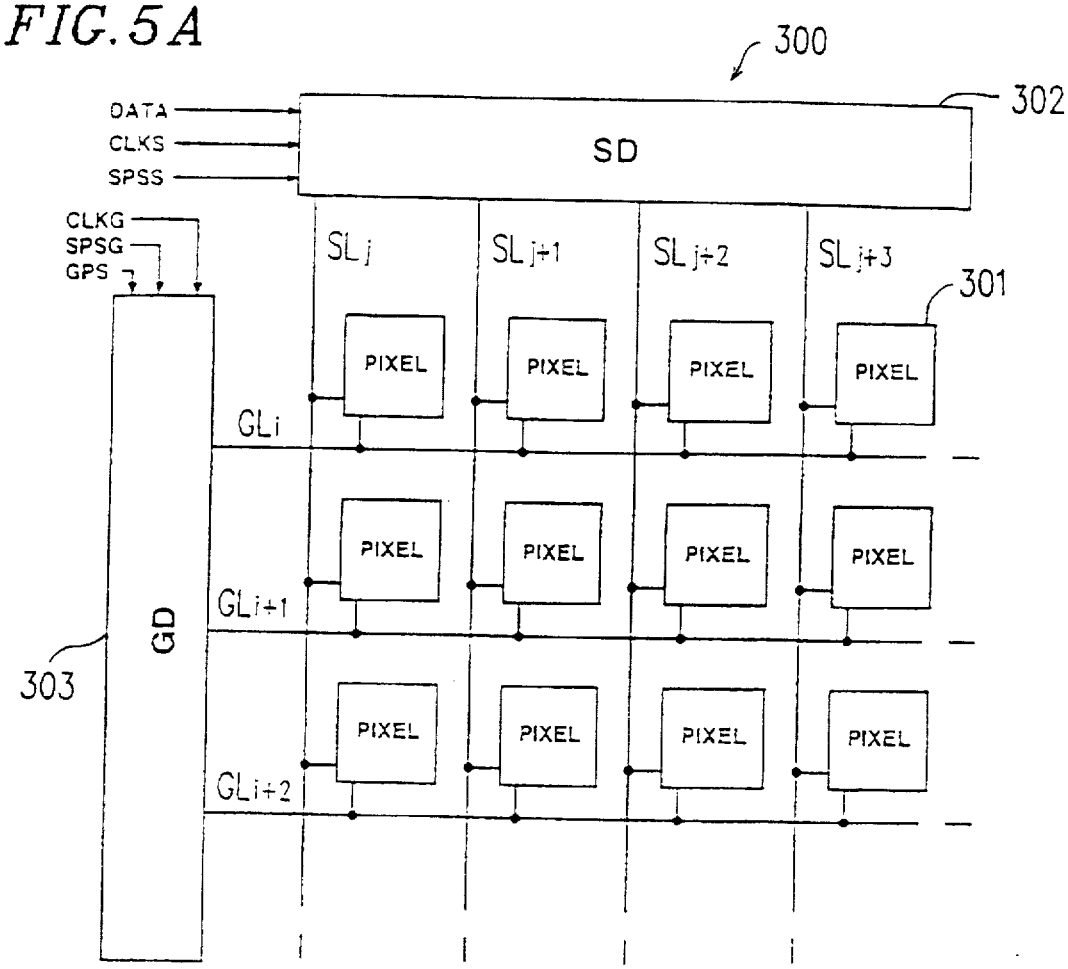
FIG. 5A is a schematic diagram of a liquid crystal display in which the pass-transistor logic circuit of the second example of the present invention is used.

FIG. 5A shows a liquid crystal display device 300 which includes pixels 301, a data signal line driving circuit (source driver) 302, and a scanning signal line driving circuit (gate driver) 303. The pixels 301 are arranged in a matrix and provided at intersections of data signal lines SLj (j=1, 2, ... ,m) and scanning signal lines GLi (i=1, 2, ... ,n), where j, i, m, and n are natural numbers. The data signal line driving circuit 302 supplies a video signal to each of the signal lines SLj, and the scanning signal line driving circuit 303 supplies a scanning signal to each of the scanning lines GLi.

Figure 5B:
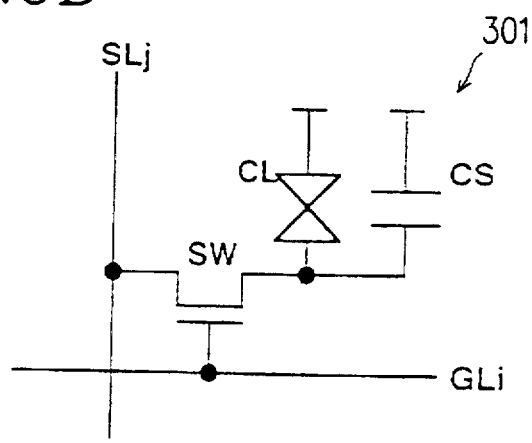
FIG. 5B is a diagram of a pixel portion of the liquid crystal display shown in FIG. 5A.

FIG. 5B shows the structure (an equivalent circuit) of a pixel 301. The pixel 301 includes a transistor (SW) as a switching element, a liquid crystal capacitance (CL), and a supplemental capacitance (CS) which is optionally provided. When one of the scanning lines GLi is selected and supplied with the scanning signal, the switching element (SW) of the corresponding pixel 301 driven into a conducting state, and the video signal on the signal line is written in the selected pixel 301 via the switching element (SW).

The video signal charges and is held by the liquid crystal capacitance (CL) and the supplemental capacitance (CS). The voltage difference between a pixel electrode and a counter electrode (not shown) modulates optical characteristics of the liquid crystal which is provided between the pixel electrode and the counter electrode.

In FIG. 5A, DATA denotes a video signal input to be written to the pixels 301, CLKS and SPSS denote timing signals for operating the data signal line driving circuit 302, and CLKG, SPSG, and GPS denote timing signals for operating the scanning signal line driving circuit 303. The scanning signal line driving circuit 303 generates a scanning signal based on a clock signal CLKG, a starting signal SPSG, and a pulse signal GPS, and supplies the scanning signal sequentially to the scanning lines GLi.

Figure 6:
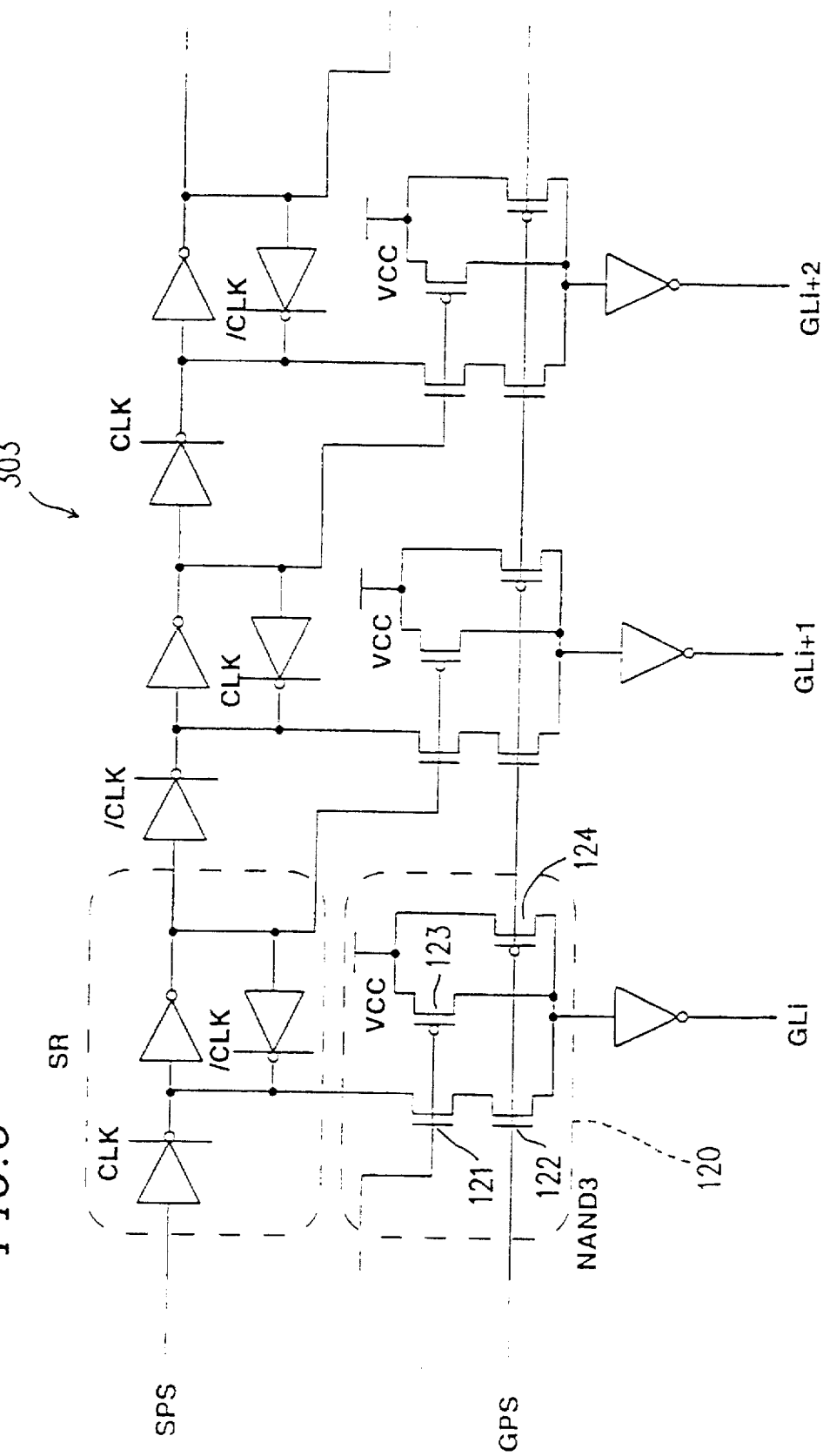
FIG. 6 is a diagram of a scanning signal line driving circuit in which the pass-transistor logic circuit of the second example of the present invention is used.

FIG. 6 shows a structure of the scanning signal line driving circuit 303 of this example. The scanning signal line driving circuit 303 has a structure for preventing the same video signal from being written in a plurality of pixels adjacent along the vertical direction (i.e. pixels connected to the different scanning lines GLi). The scanning signal line driving circuit 303 includes a pass-transistor logic circuit (NAND3) 120 for performing a three-input NAND operation for output signals of two adjoining shift registers SR and the pulse signal GPS. As shown in FIG. 6, the pass-transistor logic circuit 120 includes two n-channel thin film transistors 121 and 122, and two p-channel thin film transistors 123 and 124.

Figure 7:
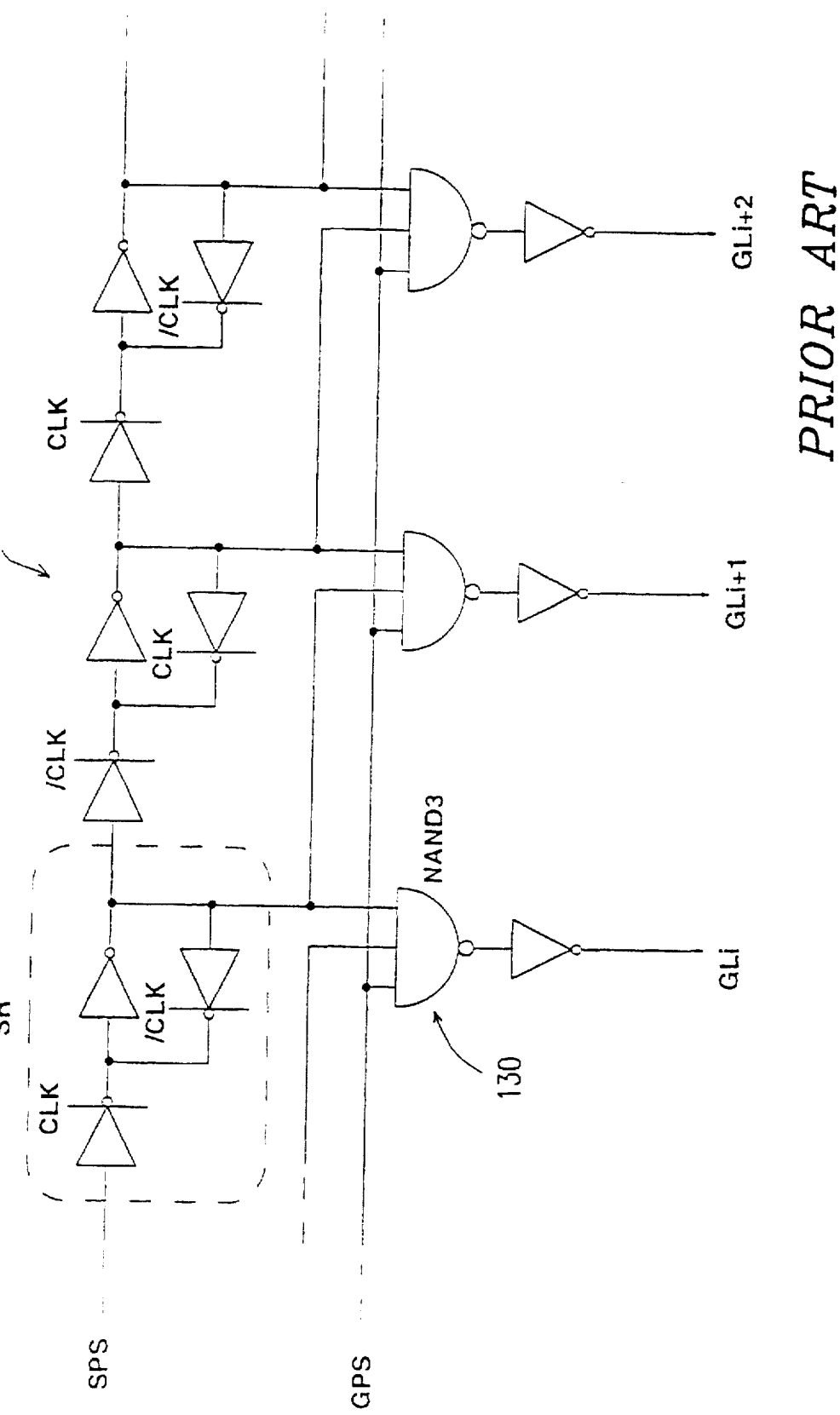
FIG. 7 is a diagram of a conventional scanning signal line driving circuit in which a conventional CMOS logic circuit is used.

FIG. 7 shows a conventional scanning signal line driving circuit 400, which uses CMOS logic for a NAND3 gate.

Figure 8:
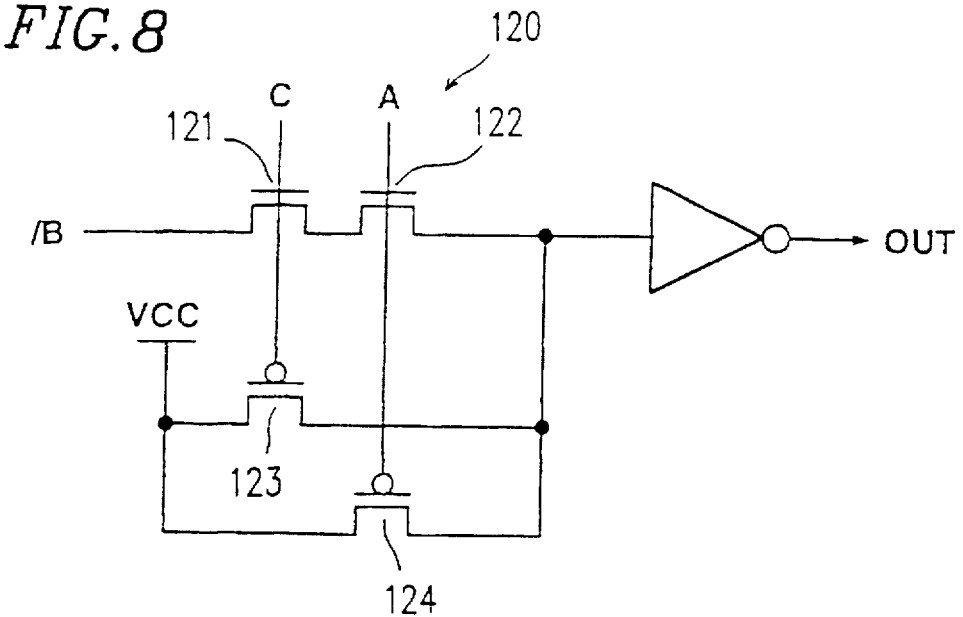
FIG. 8 is a diagram illustrating a structure of the pass-transistor logic circuit which is used in the scanning signal line driving circuit shown in FIG. 6.

FIG. 8 shows the pass-transistor logic circuit (NAND3) 120 and a buffer circuit (INV). In this example, an input signal input to respective drain electrodes of the transistors 123 and 124 which are connected in parallel are clipped at a high level (VCC). Thus, in the case of a p-channel transistor, an output signal of the transistor has a source supply voltage level (VCC) as a high level, so that the output signal can drive a larger load. Therefore, it is advantageous to use p-channel transistors for the two transistors 123 and 124 in order to realize high operation speed.

In addition, by using both n-channel transistors and p-channel transistors in a complementary manner, inverted signals are not required. This makes possible to miniaturize the logic circuit.

Figure 9:
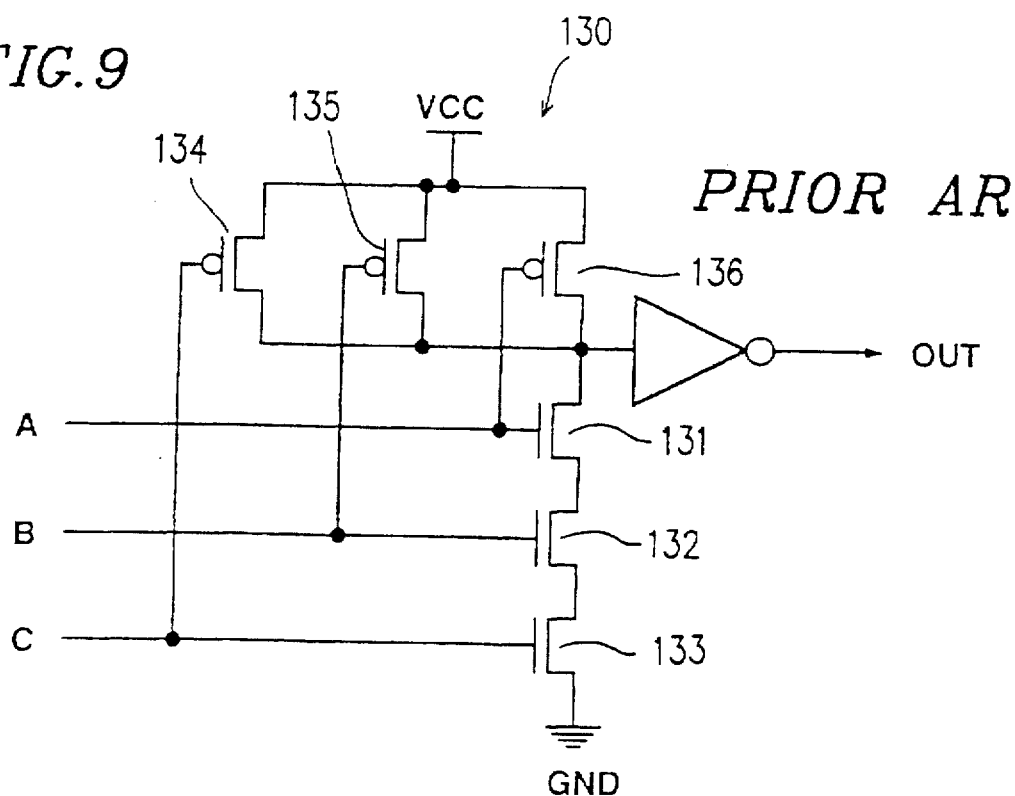
FIG. 9 is a diagram illustrating a structure of the conventional CMOS logic circuit which is used in the scanning signal line driving circuit shown in FIG. 7.

FIG. 9 shows the conventional CMOS logic circuit (NAND3) 130 and a buffer circuit (INV) which are used in the conventional scanning signal line driving circuit 400 shown in FIG. 7. As shown in FIG. 9, the conventional CMOS logic circuit (NAND3) 130 includes three n-channel transistors 131 to 133 and three p-channel transistors 134 to 136. As compared with the conventional CMOS logic 130, the pass-transistor logic circuit 120 of the present invention reduces the number of the transistors to 2/3.

Figure 10:
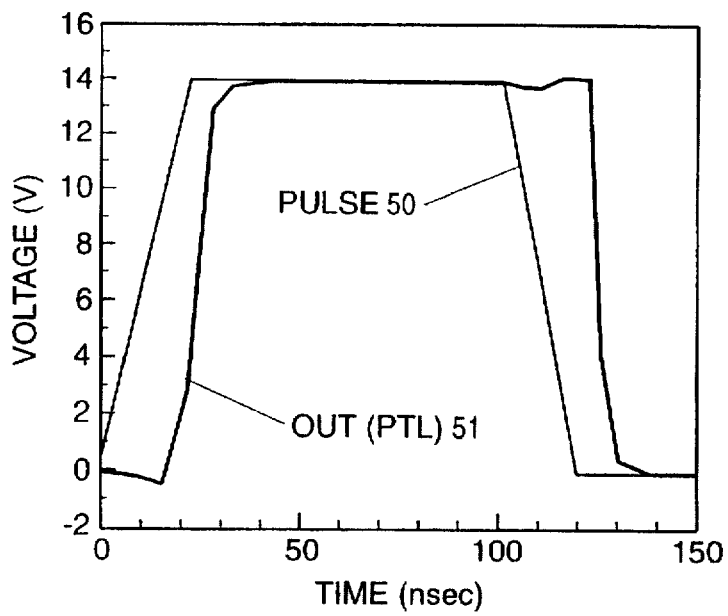
FIG. 10 is a diagram illustrating a simulation result for operation characteristics of the pass-transistor logic circuit shown in FIG. 8.
Figure 11:
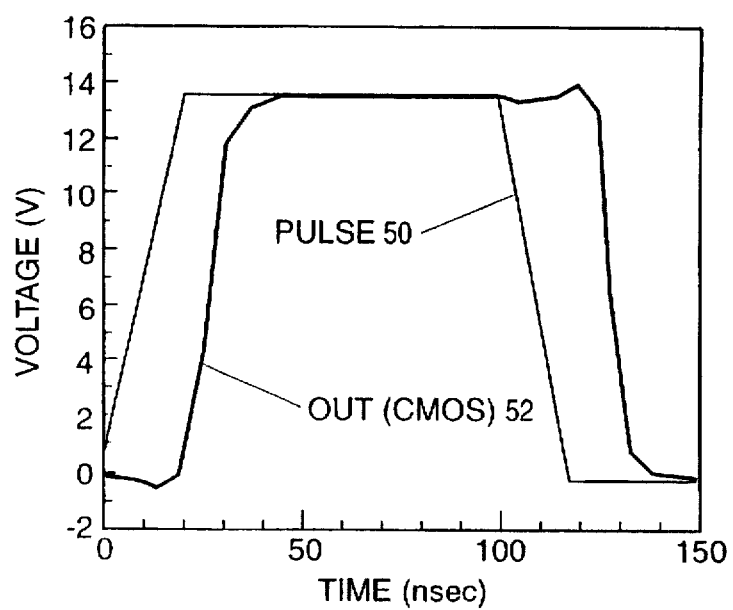
FIG. 11 is a diagram illustrating a simulation result for operation characteristics of the conventional CMOS logic circuit shown in FIG. 9.

FIGS. 10 and 11 show simulation results of the operations of the pass-transistor logic circuit 120 of the present invention and the conventional CMOS logic circuit 130, respectively. In the simulation, each of the transistors included in the logic circuits 120 and 130 is assumed to have a gate width of 0.8 μm and a thin film made of polycrystalline silicon. In FIGS. 10 and 11, curve 50 (PULSE) denotes a waveform of an input signal B (/B); curve 51 (OUT(PTL)) denotes a waveform of an output signal OUT from the pass-transistor logic circuit 120; and curve 52 (OUT (CMOS)) denotes a waveform of an output signal OUT from the conventional CMOS logic circuit 130.

As shown in FIGS. 10 and 11, the operation speed of the pass-transistor logic circuit 120 is increased by about 30% compared with that of the conventional CMOS logic circuit 130. The operation speed is measured by a root-mean-square (T) of the delay time of the output signal OUT to follow a rising edge and a falling edge of the input signal PULSE: $T=((X^2+Y^2)/2)^{1/2}$, where X denotes a time period from the time when the input signal PULSE rises to 7 volts (i.e., half of the maximum amplitude of 14 volts) in its rising edge to the time when the output signal OUT rises to 7 volts following the input signal PULSE. Similarly, Y denotes a time period from the time when the input signal PULSE falls to 7 volts from the maximum amplitude of 14 volts in its falling edge to the time when the output signal OUT falls to 7 volts following the input signal PULSE.

In this example, the pass-transistor logic circuit includes n-channel transistors and p-channel transistors, so that it is possible to operate the n-channel and p-channel transistors in a complementary manner by using one signal. This can reduce the number of signals for operating the logic circuit by, for example, eliminating the inverted signal. Accordingly, a generating circuit for the inverted signal is not required, and wirings and the like are reduced, so that the logic circuit can be miniaturized and the power consumption can be reduced.

EXAMPLE 3

In this example, another pass-transistor circuit used for the liquid crystal display 300 shown in FIG. 5A will be described.

Figure 12:
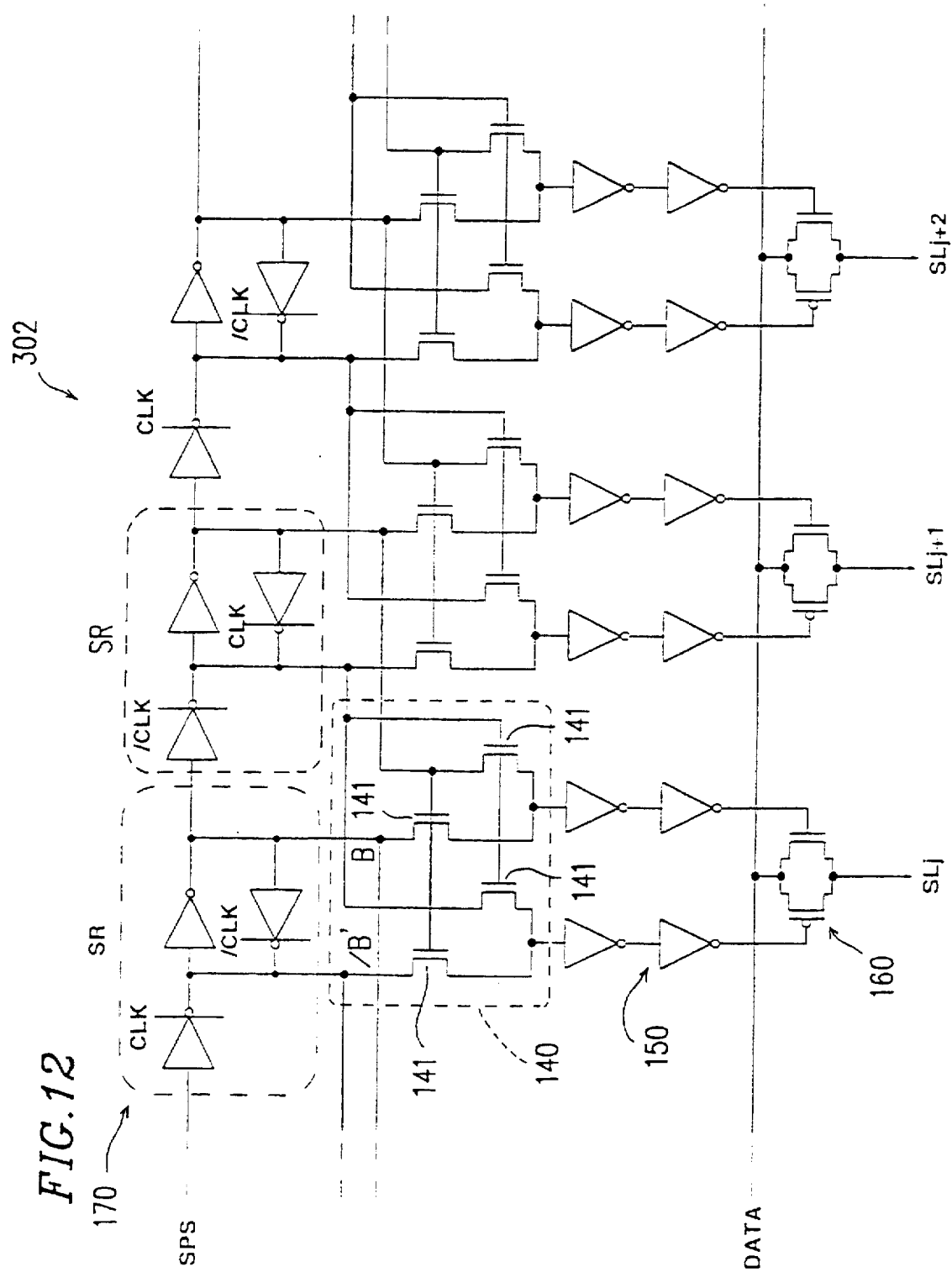
FIG. 12 is a diagram of a data signal line driving circuit in which the pass-transistor logic circuit of the third example of the present invention is used.

FIG. 12 shows a structure of the data signal line driving circuit 302 of this example. The data signal line driving circuit 302 samples the video signal DATA and supplies the video signal DATA sequentially to the data signal lines SLj, in accordance with a clock signal CLKS and a starting signal SPSS.

The data signal line driving circuit 302 has a structure for preventing the same video signal from being written in a plurality of pixels adjacent along the horizontal direction (i.e. pixels connected to the different signal lines SLj), and for minimizing a fluctuation in the video signal.

As shown in FIG. 12, the data signal line driving circuit 302 includes a pass-transistor logic circuit (AND/NAND) 140 for performing an AND/NAND operation for output signals of two adjoining shift registers SR of a shift register portion 170. The data signal line driving circuit 302 also includes a buffer circuit 150 and a sampling switch 160. The pass-transistor logic circuit 140 includes four n-channel thin film transistors 141. The sampling switch 160 is controlled by an output logic signal (AND) and its reversed signal (NAND) from the pass-transistor logic circuit 140.

As shown in FIG. 12, each shift register SR outputs a pair of signals: an output signal B and the inverted signal /B thereof. Accordingly, the data signal line driving circuit 302 is suitable to use the pass-transistor logic circuit 140, for no additional circuitry for generating an inverted signal is required. In addition, the pass-transistor logic circuit 140 outputs a pair of signals, so that it is also suitable to control the sampling switch 160 which has a CMOS structure of an n-channel transistor and a p-channel transistor.

The operation of the data signal line driving circuit 302 will be discussed below.

By performing an AND operation of two output signals of adjoining shift registers SR, an overlapping portion of the sampling pulse signals for the adjacent data signal lines SLj is eliminated as described below.

FIG. 13 shows shift register portion 170 of the data signal line driving circuit 302. As shown in FIG. 13, the shift register portion 170 consists of shift registers SRk (k=1, 2, . . .) for outputting respective sampling pulse signals Nk.

FIGS. 14A1 through 14A3 show the sampling pulse signals Nk (k=1, 2, 3) of the adjacent three shift registers SRk of the shift register portion 170. As shown in FIGS. 14A1 through 14A3, one output signal Nk overlaps an adjacent sampling pulse signal Nk+1 by a half pulse width thereof. By performing an AND operation of the adjacent sampling pulse signals Nk and Nk+1, as shown in FIGS. 14B1 through 14B3 the overlapping portion of the adjacent sampling pulse signals Nk and Nk+1 is eliminated.

In a case where the adjacent sampling pulse signals Nk and Nk+1 have an overlapping portion, it causes some problems as follows: As shown in FIG. 15, during the time the data signal is supplied to the data signal line SL2 corresponding to the sampling pulse signal N2 (i.e. the data signal is written into the corresponding pixel), the data signal supplied to the previous data signal line SL1 corresponding to the sampling pulse signal N1 is finished, and the data signal supplied to the next data signal line SL3 corresponding to the sampling pulse signal N3 is started.

When the data signal supply for the previous data signal line is finished, an OFF-noise is caused by the reduction of a load of the data signal and the change in a parasitic capacitance of the sampling transistor. Similarly, when the data signal supply for the next data signal line is started, an ON-noise is caused by the increase of a load of the data signal, the change in a parasitic capacitance of the sampling transistor, and a countercurrent of the data signal from the next signal line. The ON-noise and OFF-noise fluctuate the level of the data signal being supplied to the data signal line.

By performing an AND operation for the adjacent sampling pulse signals Nk and Nk+1, the overlapping portion of the adjacent sampling pulse signals Nk and Nk+1 is eliminated. Therefore, the ON-noise and OFF-noise are minimized so that the undesirable level fluctuation of the data signal is prevented. In addition, an unnecessary portion of the video signal is not supplied to the data signal lines SLj. This can reduce the power consumption.

The sampling switch 160 has a CMOS structure in which an n-channel transistor and a p-channel transistor are connected in parallel. This structure can compensate and reduce the noise due to turning-off of the sampling transistors. This makes it possible to realize higher display quality.

Figure 17:
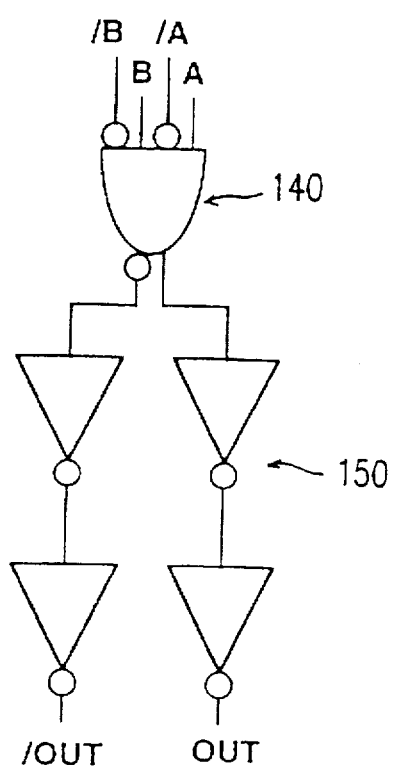
FIG. 17 is a diagram of a pass-transistor logic circuit and a buffer circuit which are used in the data signal line driving circuit shown in FIG. 12.
Figure 18:
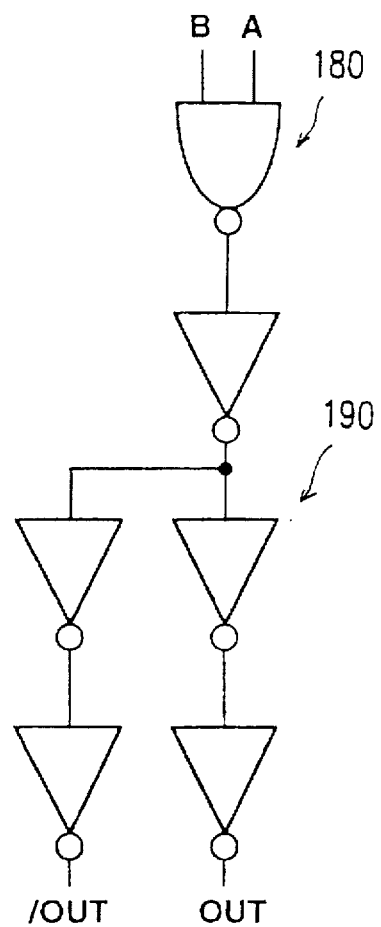
FIG. 18 is a diagram illustrating a conventional CMOS logic circuit and a buffer circuit which are used in the data signal line driving circuit shown in FIG. 16.

For comparison, a conventional data signal line driving circuit 500 is shown in FIG. 16, in which a conventional CMOS logic (NAND) 180 is used. FIG. 17 shows the pass-transistor logic circuit (AND/NAND) 140 and the buffer circuit (INVs) 150 of the present invention. FIG. 18 shows the conventional CMOS logic (NAN-D) 180 and the corresponding buffer circuit (INVs) 190.

As shown in FIGS. 17 and 18, by using the pass-transistor logic circuit 140, the number of the inverters (INVs) and the stages of inversion operations of the buffer circuit 150 can be reduced. The pass-transistor logic circuit 140 outputs a pair of signals, so that it is not required to invert the output signal to generate an inverted signal as in the case of the conventional CMOS logic circuit 180. The number of the transistors of the pass-transistor logic circuit (AND/NAND) 140 is the same as that of the conventional CMOS logic circuit (NAND) 180.

Figure 19:
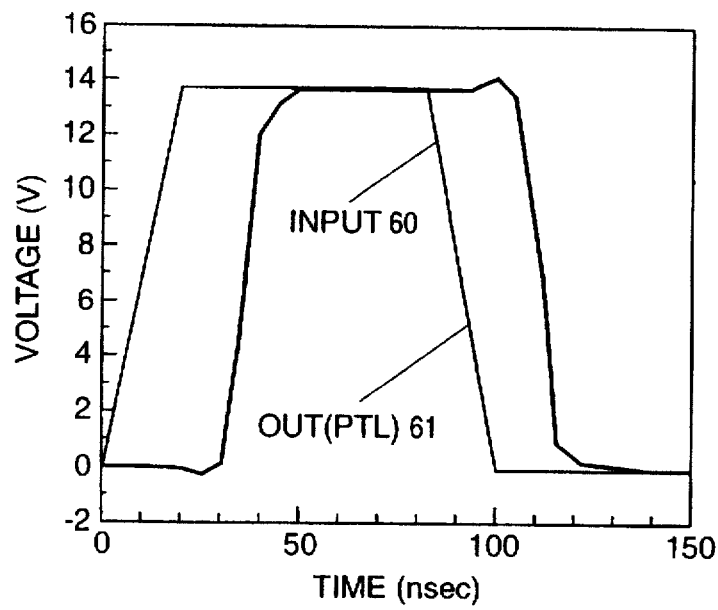
FIG. 19 is a diagram illustrating a simulation result for operation characteristics of the pass-transistor logic circuit shown in FIG. 17.
Figure 20:
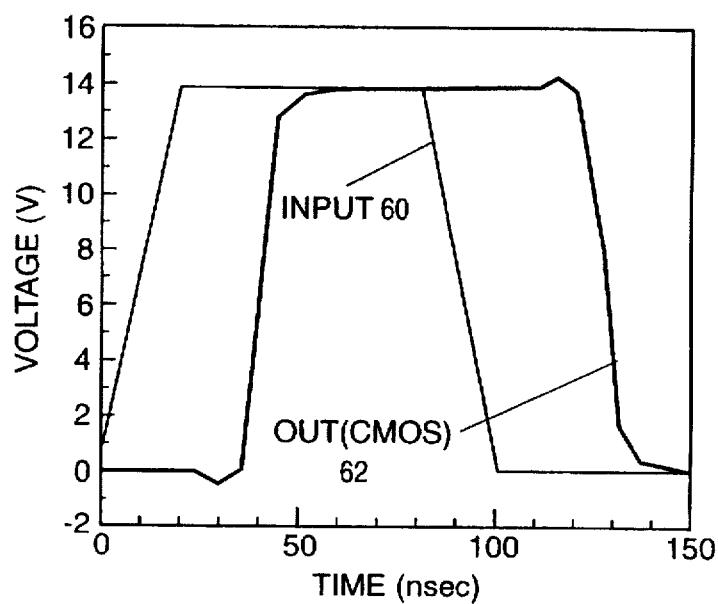
FIG. 20 is a diagram illustrating a simulation result for operation characteristics of the conventional CMOS logic circuit shown in FIG. 18.

FIGS. 19 and 20 show simulation results of the operations of the pass-transistor logic circuit 140 and the buffer circuit 150 of the present invention shown in FIG. 17, and the conventional CMOS logic 180 and the corresponding buffer circuit 190 shown in FIG. 18, respectively. In the simulation, each of the transistors included in the logic circuits 140 and 180 is assumed to have a gate width of 8 μm, and to have a thin film made of polycrystalline silicon. In FIGS. 19 and 20, curve 60 (INPUT) denotes a waveform of an input signal A (/A); curve 61 (OUT(PTL)) denotes a waveform of an output signal OUT from the pass-transistor logic circuit 140 via the buffer circuit 150; and curve 62 (OUT(CMOS)) denotes a waveform of an output signal OUT from the conventional CMOS logic circuit 180 via the buffer circuit 190.

As shown in FIGS. 19 and 20, the operation speed of the pass-transistor logic circuit 140 is increased by about 30% compared with that of the conventional CMOS logic circuit 180. The operation speed is measured by a root-mean-square (T) of the delay time of the output signal OUT to follow a rising edge and a falling edge of the input signal INPUT: $T=((X^2+Y^2)/2)^{1/2}$, where X denotes a time period from the time when the input signal INPUT rises to 7 volts (i.e., half of the maximum amplitude of 14 volts) in its rising edge to the time when the output signal OUT rises to 7 volts following the input signal INPUT. Similarly, Y denotes a time period from the time when the input signal INPUT falls to 7 volts from the maximum amplitude of 14 volts in its falling edge to the time when the output signal OUT falls to 7 volts following the input signal INPUT.

As described above, by using the pass-transistor logic circuit of the present invention, the data signal line driving circuit can be miniaturized and the operation speed thereof can be increased.

In Examples 2 and 3, the applications of the pass-transistor logic circuit for the driving circuits of a liquid crystal display have been described. The driving circuits may be formed on an insulator substrate other than the pixel array substrate of the liquid crystal display. However, it is advantageous to form the driving circuits and the pixel array monolithically on one insulator substrate for reducing process-costs and mounting-costs, and for miniaturizing the display system.

By using the pass-transistor logic circuit for the driving circuits of the liquid crystal display, peripheral circuits for the liquid crystal display is miniaturized, so that a larger display area is realized by using the same size of the insulator substrate.

The thin film transistors may have a thin film made of amorphous silicon or semiconductor material other than silicon, as well as monocrystalline silicon or polycrystalline silicon.

The pass-transistor logic circuit of the present invention is not limited to a combination of XOR/XNOR logic modules including an adder, or AND/NAND logic modules for the driving circuits of the liquid crystal display. The pass-transistor logic circuit of the present invention may be used for a pixel array or display systems other than the driving circuits of the liquid crystal display.

In addition, a driving circuit may be provided to a device for each pixel in a pixel array by using a pass-transistor logic circuit of the present invention. Such a driving circuit is advantageous for miniaturizing the system, for simplifying manufacturing processes, and for increasing reliability of the system.

For example, in the case where the pass-transistor logic circuit of the present invention is used for the pixel array of the liquid crystal display, an area for a logic circuit portion in the pixel array is reduced, so that an area for the pixel electrodes for display can be increased. This makes an aperture ratio of the display larger, resulting in a display which is brighter and has a high contrast. In addition, by reducing luminance of a back light of the liquid crystal panel, the power consumption of the liquid crystal display can be reduced.

Figure 21A:
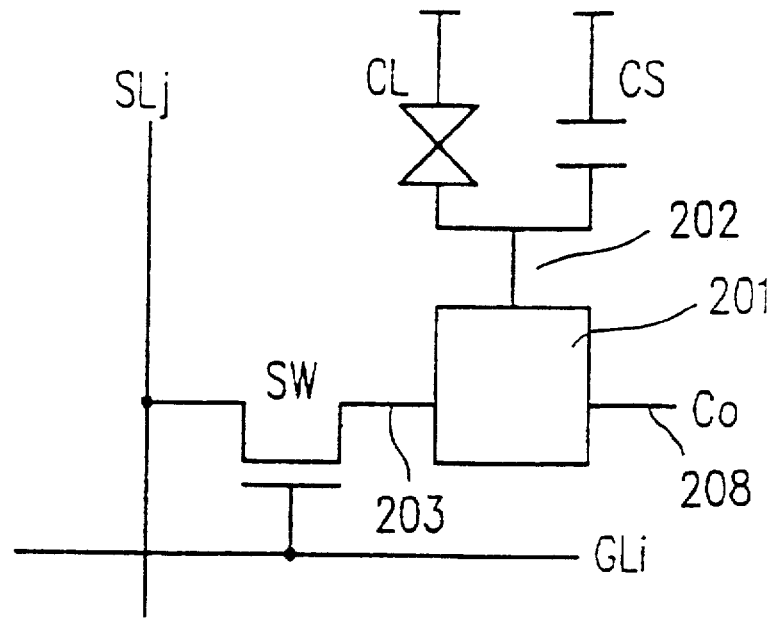
FIG. 21A is a diagram of a pixel portion of a liquid crystal display in which a pass-transistor logic circuit of the present invention is provided.

FIG. 21A shows a pass-transistor logic circuit 201 provided in each pixel of the liquid crystal display. As shown in FIG. 21A, the pass-transistor logic circuit 201 is connected between a pixel switch (transistor) SW and a liquid crystal capacitance CL and a supplemental capacitance CS. The pass-transistor logic circuit 201 provides a logic output 202 to the liquid crystal capacitance CL and the supplemental capacitance CS based on an output signal 203 of the pixel switch SW and a control signal 208 (Co).

Figure 21B:
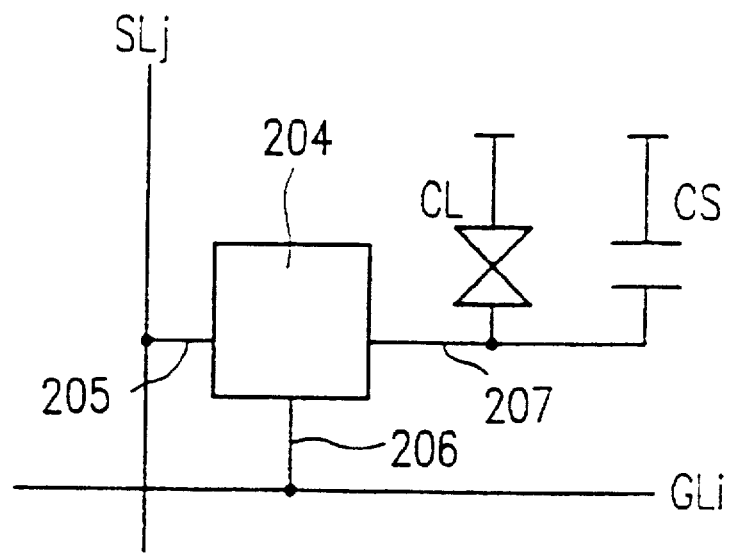
FIG. 21B is a diagram of a pixel portion of a liquid crystal display in which a pass-transistor logic circuit is provided instead of a switching transistor.
Figure 24A:
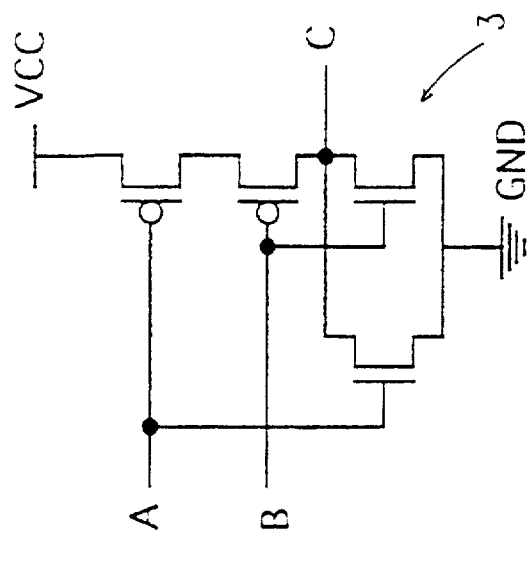
FIGS. 24A and 24B are diagrams illustrating a circuit structure and a corresponding logic function of a conventional CMOS logic circuit (NOR).
Figure 23A:
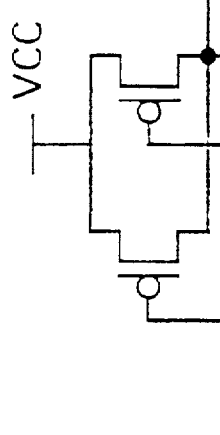
FIGS. 23A and 23B are diagrams illustrating a circuit structure and a corresponding logic function of a conventional CMOS logic circuit (NAND).
Figure 22A:
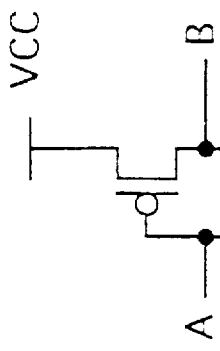
FIGS. 22A and 22B are diagrams illustrating a circuit structure and a corresponding logic function of a conventional CMOS logic circuit (INV).
Figure 24B:
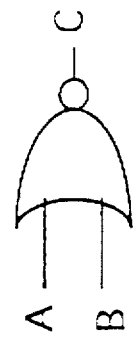
Figure 23B:
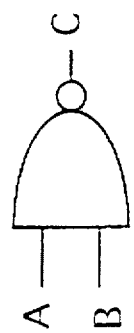
Figure 22B:
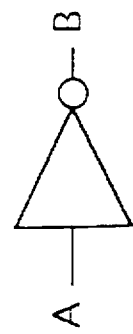

FIG. 21B shows a pass-transistor logic circuit 204 provided in each pixel instead of the switch SW of the pixel 301 as shown in FIG. 5B. As shown in FIG. 21B, the pass-transistor logic circuit 204 receives an input signal 205 from a data signal line SLj and an input signal 206 from a scanning signal line GLi as logic input signals, and outputs a logic signal 207 to the liquid crystal capacitance CL and the supplemental capacitance CS.

In the above mentioned examples, the input signals are input to a gate electrode and a drain electrode of the transistor of the pass-transistor logic circuit. The input signals may be input to a gate electrode and a source electrode, for the drain electrode and the source electrode are equivalent in a field effect transistor.

A person having ordinary skill in the art can understand that signals A, B, and C, and inverted signals /A, /B, and /C which appear in different Figures are not necessarily identical between different Figures.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A logic circuit for performing a logic operation on a plurality of input logic signals and outputting a resultant logic signal, the logic circuit comprising a pass-transistor logic circuit, wherein field effect transistors included in the pass-transistor circuit are thin film transistors, and a first and second of said transistors have commonly coupled gate electrodes to receive a first logic signal, a source electrode of the first transistor and a drain electrode of said second transistor being commonly coupled to receive a second logic signal, and a drain electrode of the first transistor and a source electrode of the second transistor outputting a result of a logic operation performed by the first and second transistors on the first and second logic signals.

2. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled, a gate electrode of each of the at least two field effect transistors being commonly coupled and receiving a corresponding first logic signal, and one of a drain and source electrodes of each of said at least two transistors receiving a corresponding second logic signal; and a node for coupling an other of the drain and source electrodes of each of the at least two field effect transistors for outputting the resultant logic signal, wherein the plurality of field effect transistors are thin film transistors (TFTs).

3. A logic circuit according to claim 2, wherein a thin film of each TFT is made of one of amorphous silicon, polycrystalline silicon, and monocrystalline silicon.

4. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled to form a pair of transistors, a gate electrode of each field effect transistor of the pair receiving a corresponding first logic signal, and one of a drain and source electrodes for each field effect transistor of the pair receiving a corresponding second logic signal; and a node for coupling the pair of field effect electrodes and other of the plurality of field effect transistors, and for outputting the resultant logic signal, wherein the plurality of field effect transistors are thin film transistors (TFTs).

5. A logic circuit according to claim 4, wherein a thin film of each TFT is made of one of amorphous silicon, polycrystalline silicon, and monocrystalline silicon.

6. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled, a gate electrode of each of the at least two field effect transistors receiving a corresponding first logic signal, and one of a drain and source electrodes from each of the at least two field effect transistors receiving a corresponding second logic signal; and a node for coupling another of the drain and source electrodes of each of the at least two field effect transistors, and for outputting the resultant logic signal, wherein the plurality of field effect transistors are thin film transistors (TFTs), and the pass-transistor logic circuit includes a pair of nodes for outputting a pair of signals comprising the resultant logic signal and an inverted signal thereof.

7. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled, a gate electrode of each of the at least two field effect transistors receiving a corresponding first logic signal, and one of a drain and source electrodes from each of the at least two field effect transistors receiving a corresponding second logic signal; and a node for coupling another of the drain and source electrodes of each of the at least two field effect transistors, and for outputting the resultant logic signal, wherein the plurality of field effect transistors are thin film transistors (TFTs), and the pass-transistor logic circuit consists of common channel type TFTs of which an ON-resistance per channel width is less than that of other channel type TFTs.

8. A logic circuit for performing a logic operation on plurality of input logic signals and outputting a resultant logic signal, the logic circuit comprising a pass-transistor logic circuit including:

a plurality of field effect transistors, at least two of the plurality of field effect transistors being coupled to form a pair of transistors, a gate electrode of each field effect transistor of the pair receiving a corresponding first logic signal, and one of a drain and source electrodes of each transistor of the pair receiving a corresponding second logic signal; and a node for coupling the pair of transistors and other of the plurality of field effect transistors for outputting the resultant logic signal, wherein the plurality of field effect transistors are thin film transistors (TFTs), and the pass-transistor logic circuit includes both n-channel TFTs and p-channel TFTs.

9. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled, a gate electrode of each of the at least two field effect transistors receiving a corresponding first logic signal, and one of a drain and source electrode from each of the at least two field effect transistors receiving a corresponding second logic signal; and a node for coupling another of the drain and source electrodes of the at least two field effect transistors to output the resultant logic signal, wherein the plurality of field effect transistors are thin film transistors (TFTs), and a thin film of each TFT is made of one of amorphous silicon, polycrystalline silicon, and monocrystalline silicon, and the thin film of the TFTs is a polycrystalline silicon thin film formed on a glass substrate.

10. A logic circuit for performing a logic operation on plurality of input logic signals and outputting a resultant logic signal, the logic circuit comprising a pass-transistor logic circuit including:

a plurality of field effect transistors, at least two of the plurality of field effect transistors being coupled to form a pair of transistors, a gate electrode of each field effect transistor of the pair receiving a corresponding first logic signal, and one of a drain and source electrode from each transistor in the pair receiving a corresponding second logic signal; and a node for coupling the pair of transistors and other of the plurality of field effect transistors, and for outputting the resultant logic signal, wherein the plurality of field effect transistors are thin film transistors (TFTs), and a thin film of each TFT is made of one of amorphous silicon, polycrystalline silicon, and monocrystalline silicon, and the thin film of the TFTs is a polycrystalline silicon thin film formed on a glass substrate.

11. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled, a gate electrode of each of the at least two field effect transistors receiving a corresponding first logic signal, and one of a drain and source electrode from each of the at least two field effect transistors receiving a corresponding second logic signal; and a node for coupling an other of the drain and source electrodes of the at least two field effect transistors to output the resultant logic signal, wherein the plurality of field effect transistors are thin film transistors (TFTs), and the pass-transistor logic circuit is formed on a substrate, and switching TFTs for a pixel array of a liquid crystal display also being formed on the substrate.

12. A logic circuit for performing a logic operation on a plurality of input logic signals and outputting a resultant logic signal, the logic circuit comprising a pass-transistor logic circuit including:

a plurality of field effect transistors, at least two of the plurality of field effect transistors being coupled to form a pair of transistors, a gate electrode of each field effect transistor of the pair receiving a corresponding first logic signal, and one of a drain and source electrode of each transistor of the pair receiving a corresponding second logic signal; and a node for coupling the pair of transistors and other of the plurality of field effect transistors to output the resultant logic signal, wherein the plurality of field effect transistors are thin film transistors (TFTs), and the pass-transistor logic circuit is formed on a substrate, and switching TFTs for a pixel array of a liquid crystal display also being formed on the substrate.

13. A liquid crystal display comprising:

a pixel array including a plurality of pixels arranged in a matrix on an insulator substrate;

a plurality of data signal lines for supplying a data signal to each pixel;

a plurality of scanning signal lines for supplying a scanning signal to each pixel, the scanning signal controlling the supply of the data signal to the pixel;

a data signal line driving circuit for controlling application of the data signal to each of the data signal lines; and a scanning signal line driving circuit for controlling application of the scanning signal to each of the scanning signal lines, wherein at least one of the pixel array, the data signal line driving circuit, and the scanning signal line driving circuit comprises a logic circuit for performing a logic operation on a plurality of input logic signals and outputting a resultant logic signal, wherein the logic circuit comprises a pass-transistor logic circuit including:

a plurality of field effect transistors, at least two of the plurality of field effect transistors being coupled in series, a gate electrode of each of the at least two field effect transistors receiving a corresponding first logic signal, and one of drain and source electrodes receiving a corresponding second logic signal; and a node for coupling the other of the drain and source electrodes of the at least two field effect transistors, and for outputting the resultant logic signal, and wherein the plurality of field effect transistors are thin film transistors (TFTs).

14. A logic circuit for performing a logic operation on a plurality of input logic signals, comprising a pass-transistor logic circuit including:

a plurality of thin film transistors (TFTs);

a first node for coupling source electrodes of a first TFT and a second TFT included in the plurality of TFTs, and for outputting a resultant logic signal; and a second node for coupling source electrodes of a third TFT and a fourth TFT included in the plurality of TFTs, and for outputting an inverted signal of the resultant logic signal.

wherein a first logic signal is input to a drain electrode of the first TFT, an inverted first logic signal is input to a drain electrode of the third TFT, a second logic signal is input to a drain electrode of the second TFT and an inverted second logic signal is input to a drain electrode of the fourth TFT, and wherein one of the second logic signal and the inverted second logic signal is input to gate electrodes of the first TFT and the third TFT, and the other of the second logic signal and the inverted second logic signal is input to gate electrodes of the second TFT and the fourth TFT.

15. A logic circuit for performing a logic operation on a plurality of input logic signals, comprising a pass-transistor logic circuit including:

a plurality of thin film transistors (TFTs);

a first node for coupling source electrodes of a first TFT and a second TFT included in the plurality of TFTs, and for outputting a resultant logic signal; and a second node for coupling source electrodes of a third TFT and a fourth TFT included in the plurality of TFTs, and for outputting an inverted resultant logic signal, wherein a first logic signal is input to drain electrodes of the first TFT and the fourth TFT, and an inverted first logic signal is input to drain electrodes of the second TFT and the third TFT, and wherein a second logic signal is input to gate electrodes of the second TFT and the fourth TFT, and an inverted second logic signal is input to gate electrodes of the first TFT and the third TFT.

16. A logic circuit for performing a logic operation on a plurality of input logic signals, comprising a pass-transistor logic circuit including a plurality of thin film transistors (TFTs), wherein at least two TFTs of the plurality of TFTs are coupled to form a pair, the TFTs included in the pair consisting of common channel type TFTs, a gate electrode of each TFT of the pair receiving a corresponding first logic signal, and one of drain and source electrodes of each TFT of the pair receiving a corresponding second logic signal, and wherein a complimentary TFT of other channel type is provided for each TFT of the pair, a gate electrode of the complementary TFT receiving the corresponding first logic signal.

* * * * *